(12) United States Patent
Okuyama et al.

(10) Patent No.: US 8,044,455 B2
(45) Date of Patent: Oct. 25, 2011

(54) SEMICONDUCTOR DEVICE AND METHOD OF MANUFACTURING THE SAME

(75) Inventors: Yutaka Okuyama, Kokubunji (JP); Tsuyoshi Arigane, Akishima (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 127 days.

(21) Appl. No.: 12/683,935

(22) Filed: Jan. 7, 2010

(65) Prior Publication Data

US 2010/0193856 A1 Aug. 5, 2010

(30) Foreign Application Priority Data

Jan. 9, 2009 (JP) .................................. 2009-003551

(51) Int. Cl.
*H01L 29/792* (2006.01)
(52) U.S. Cl. ......... 257/324; 257/E21.679; 257/E27.103; 438/267
(58) Field of Classification Search ............... 257/324, 257/E21.679, E27.103; 438/267
See application file for complete search history.

(56) References Cited

U.S. PATENT DOCUMENTS

| | | | | |
|---|---|---|---|---|
| 6,972,997 B2 * | 12/2005 | Ishimaru et al. | ......... | 365/185.29 |
| 7,872,298 B2 * | 1/2011 | Shimamoto et al. | ......... | 257/320 |

FOREIGN PATENT DOCUMENTS

| | | |
|---|---|---|
| JP | 2003-046002 A | 2/2003 |
| JP | 2004-363122 A | 12/2004 |

* cited by examiner

*Primary Examiner* — Trung Q Dang
(74) *Attorney, Agent, or Firm* — Miles & Stockbridge P.C.

(57) ABSTRACT

A step is provided between a substrate surface of a select gate and a substrate surface of a memory gate. When the substrate surface of the select gate is lower than the substrate surface of the memory gate, electrons in a channel upon writing obliquely flow in the step portion. Even if the electrons obtain the energy required for passing a barrier during the oblique flow, the electron injection does not occur because electrons are away from the substrate surface. The injection can occur only on a drain region side from a position where the electrons reach the substrate surface. As a result, the injection of the electrons into a gap region is suppressed, so that the electron distribution comes close to the hole distribution. Therefore, variation in a threshold value upon information retention is suppressed, and information-retaining characteristics of a memory cell are improved.

19 Claims, 41 Drawing Sheets

SEMICONDUCTOR DEVICE AND METHOD OF MANUFACTURING THE SAME

CROSS-REFERENCE TO RELATED APPLICATION

The present application claims priority from Japanese Patent Application No. JP 2009-003551 filed on Jan. 9, 2009, the content of which is hereby incorporated by reference into this application.

TECHNICAL FIELD OF THE INVENTION

The present invention relates to a semiconductor device and a method of manufacturing the same. More particularly, the present invention relates to a technique effectively applied to a semiconductor device having an electrically-rewritable nonvolatile memory and a method of manufacturing the same.

BACKGROUND OF THE INVENTION

A semiconductor device in which an electrically-rewritable nonvolatile memory and a microcomputer are mix mounted on a single silicon substrate is widely used in industrial machines, home electronics, vehicle-installed devices, and the like as an embedded microcomputer.

The nonvolatile memory of the above-described semiconductor device stores programs required by the microcomputer, and the programs are read to use as needed. As cell structures of the nonvolatile memory suitable for such a mix mounting, there is a split gate memory cell in which a select MOS (metal oxide semiconductor) transistor and a memory MOS transistor are connected in series.

Among split gate memory cells, more particularly, in a memory cell structure in which a gate electrode of the memory MOS transistor (hereinafter, referred to as a memory gate) is disposed on a sidewall of a gate electrode of the select MOS transistor (hereinafter, referred to as a select gate) by utilizing a self-alignment technique, a gate length of the memory gate can be shorten to a minimum resolution size of lithography or less, and therefore, it is known to achieve a finer memory cell compared with a memory cell structure in which a select gate and a memory gate are individually formed by etching with using a photoresist film as a mask (for example, Japanese Patent Application Laid-Open Publication No. 2003-046002 (Patent Document 1)).

The memory MOS transistor among the two types of MOS transistors constituting the split gate memory cell stores information by retaining charges in a gate insulating film, and there are mainly two types for this charge retention. One of them is a floating-gate type (for example, Japanese Patent Application Laid-Open Publication No. 2004-363122 (Patent Document 2)) using an electrically-isolated conductive polycrystalline silicon film for a part of the gate insulating film, and the other is a MONOS (Metal Oxide Nitride Oxide Semiconductor) type (for example, Patent Document 1) storing charges in an insulating film such as a silicon nitride film having a property of storing charges.

In both of the above-described two charge-retaining types, a silicon dioxide film having an excellent insulating property is inserted between a charge-storing region and a silicon substrate. However, in the floating-gate type, if a local leakage path occurs in the silicon dioxide film, there is a problem that the charges cannot be retained since the retained charges are leaked to the substrate side through the leakage path. On the other hand, in the MONOS type, there is an advantage that merely the retained charges around the leakage path are leaked since the retained charges are spatially dispersed in the insulating film which is the charge-trapping film, so that extreme reduction in charge retention life does not occur.

FIG. 41 illustrates a cross-sectional structure of a memory cell employing the MONOS type as the charge-retaining method among the split gate memory cells utilizing a self-alignment technique. The memory cell is composed of a select MOS transistor and a memory MOS transistor. After a select gate 8 is formed, a memory gate 15 is formed on a sidewall of the select gate 8 via a gate insulating film 52 in a self-aligning manner. A gate insulating film 54 in the select MOS transistor is composed of a silicon dioxide film, and the gate insulating film 52 in the memory MOS transistor is composed of a triple-layer film in which a bottom oxide film 52a of a first potential barrier film, a silicon nitride film 52b of a charge-trapping film, and a top oxide film 52c of a second potential barrier film are stacked in this order. Although not illustrated, the select gate 8 is connected to a select gate line, and the memory gate 15 is connected to a word line, respectively. Also, a source region 55 in the select MOS transistor is connected to a common source line, and a drain region 56 in the memory MOS transistor is connected to a data line, respectively.

Writing to the memory cell is carried out by turning the select MOS transistor to be on-state and applying a predetermined voltage to the drain region 56 and the memory gate 15 in the memory MOS transistor at the same time. At this time, when setting a condition which generates a high electric field at a boundary region between the select MOS transistor and the memory MOS transistor, hot electrons are generated on a surface of a p-type well 3 in this region, and a part of the hot electrons is injected to the memory gate 15 side (SSI: Source Side Injection). The injected hot electrons are trapped by the silicon nitride film 52b which is a part of the gate insulating film 52 in the memory MOS transistor to write information. On the other hand, erasing of the information is carried out by applying a negative bias and a positive bias to the memory gate 15 and the drain region 56, respectively to generate hot holes by using band-to-band tunneling, and neutralizing the electrons by injecting the hot holes into the silicon nitride film 52b (hot-hole erase).

SUMMARY OF THE INVENTION

FIG. 1 is a schematic cross-sectional view illustrating an outline constitution of a split gate memory cell studied by the present inventors. In FIG. 1, a symbol 1 denotes a silicon substrate, a symbol 8 denotes a select gate (control gate) electrode, a symbol 12 denotes a bottom oxide film, a symbol 13 denotes a silicon nitride film, a symbol 14 denotes a top oxide film, a symbol 15 denotes a memory gate, a symbol 55 denotes a source region, and a symbol 56 denotes a drain region. As illustrated in FIG. 1, the hot-electron injection upon the data writing is mainly carried out at a position "a" on the control gate electrode side, and the hot-hole injection upon the data erasing is mainly carried out at a position "b" on the drain region side. That is, since the hot-electron injection position (position a) upon the data writing and the hot-hole injection position (position b) upon the data erasing are spatially apart from each other, a difference is easily generated in distributions of the hot electrons upon the writing and the hot holes upon the erasing. More particularly, a region sandwiched by the control gate and the memory gate (hereinafter, referred to as a gap region, and a distance between the control gate and the memory gate is referred to as a gap length) significantly affects a threshold voltage of the memory MOS transistor. And, electrons are easily and holes are not easily injected into the region, and therefore, electrons easily remain therein.

When the difference is generated in the distributions of the hot electrons upon the writing and the hot holes upon the erasing, electrons and holes are mutually diffused in the charge-storing film upon the information retention to cause variation in the threshold voltage. The higher a retention temperature is, the more the diffusion of the electrons and holes is accelerated, so that the variation in the threshold voltage becomes significant.

When the hot-electron injection position and the hot-hole injection position come closer to each other by reducing the width of the memory gate 15, deteriorations in the data retention characteristics and the data write/erase endurance can be suppressed. However, when the width of the memory gate 15 is reduced, a length of a channel below the memory gate 15 in a MONOS type FET is also shortened, and therefore, the MONOS type FET cannot be cut off (punch-through resistance is lowered), and, as a result, an off-leakage current in the memory cell is increased.

A preferred aim of the present invention is to provide a technique capable of improving the retention characteristics of the split-gate memory cell employing the MONOS type by bringing the electron distribution close to the hole distribution.

The above and other preferred aims and novel characteristics of the present invention will be apparent from the description of the present specification and the accompanying drawings.

In order to set the electron injection position away from the gap region and bring it close to a drain region, it is effective to structurally prevent the electron injection to the gap region. FIG. 2 illustrates a memory structure in which a step is provided between a substrate surface of a select gate and a substrate surface of a memory gate. As illustrated in the figure, when the substrate surface of the select gate is lower than the substrate surface of the memory gate, the electrons in the channel obliquely flow along arrows in the step portion. Therefore, even if the electrons obtain the energy required for passing a barrier, the injection does not occur as long as the electrons flow away from the substrate surface. The injection can occur only on the drain side from a position "c" where the electrons reach the substrate surface.

Also, when there is a step having a height of "d", the electrons in the channel flow along the arrows, and therefore, the electrons reach the substrate surface as obtaining momentum in a direction toward the memory gate, so that an injection efficiency is improved compared with that of a flat case without the step.

FIG. 3 illustrates a step dependency with respect to an edge position on the source side of the electron-injection distribution and an amount of the injection charge obtained by device simulations. First, the injection distribution is further moved to the drain side by a larger step, so that the injection into the gap region is reduced. That is, a lower limit value of the step for eliminating components of the electron injection into the gap region depends on the gap length. For example, when the gap length is 20 nm, and if the step has a height of 4 nm or larger, the components of the electron injection into the gap region are eliminated. If the gap length is 17 nm or smaller, the injection into the gap region does not occur even without the step, and therefore, the lower limit value is 0. Meanwhile, if the step has a height of 16 nm or smaller, the injection charge amount is increased compared with the case without the step, and if the height is 16 nm or larger, the amount is decreased. Therefore, an upper limit value of the step is 16 nm. Note that, if the gap length is 26 nm or larger, it is impossible to achieve both of suppressing the electron injection into the gap region and preventing the reduction of the injection efficiency compared with that of the flat case in the substrate. As described above, a range of the height of the step d for suppressing the electron injection into the gap region and preventing the reduction of the injection efficiency compared with that of the flat case in the substrate is 0 nm or larger and 16 nm or smaller if the gap length "x" is 17 nm or smaller, and is (1.8x−30) nm or larger and 16 nm or smaller if the gap length is 17 nm or larger and 26 nm or smaller.

The typical ones of the inventions disclosed in the present application will be briefly described as follows.

A semiconductor device has a memory cell formed on a main surface of a semiconductor substrate of a first conductive type, and the memory cell includes:

a select gate formed on the semiconductor substrate via a first gate insulating film;

a memory gate formed on one sidewall of the select gate and insulated from the select gate and the semiconductor substrate via a second gate insulating film;

a source region composed of a semiconductor region of a second conductive type and formed in the semiconductor substrate in a vicinity of the select gate; and a drain region composed of a semiconductor region of a second conductive type and formed in the semiconductor substrate in a vicinity of the memory gate, the second gate insulating film is composed of at least a potential barrier film and a charge-trapping film stacked on the potential barrier film, and a substrate interface of the select gate is positioned lower than that of the memory gate.

The effects obtained by typical aspects of the present invention will be briefly described below.

Information retention characteristics of a memory cell employing a MONOS type can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Further, in the embodiments described below, when referring to the number of elements (including number of pieces, values, amount, range, and the like), the number of the elements is not limited to a specific number unless otherwise stated or except the case where the number is apparently limited to a specific number in principle. Also, when "composed of A" or "constituted by A" is described for components or the like in embodiments, it goes without saying that other components are not eliminated unless otherwise specified to be only the component.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

In addition, when materials and others are mentioned, specified one is a main material unless otherwise stated not to be so or it is principally or apparently not to be so, and subsidiary components, additives, additional components, and others are not eliminated. For example, a silicon material includes not only pure silicon but also binary or ternary alloy (for example, SiGe) having additive impurities and silicon as a main component or others unless otherwise stated.

Also, components having the same function are denoted by the same reference symbols throughout the drawings for describing the embodiment, and the repetitive description thereof will be omitted.

Further, in some drawings used in the embodiments, hatching is used even in a plan view so as to make the drawings easy to see.

First Embodiment

Figure 1:
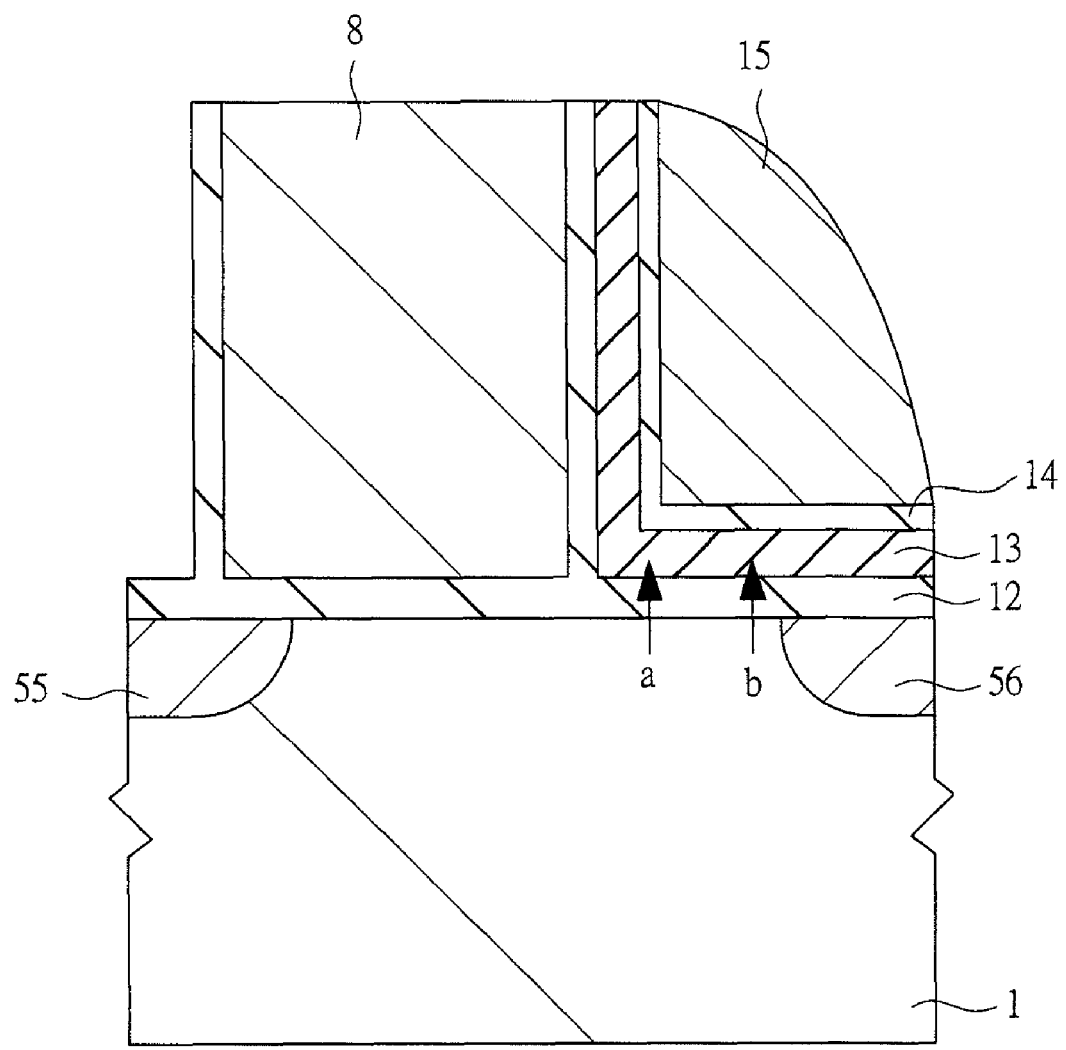
FIG. 1 is a cross-sectional view of a principal part of a semiconductor device studied by the present inventors.
Figure 2:
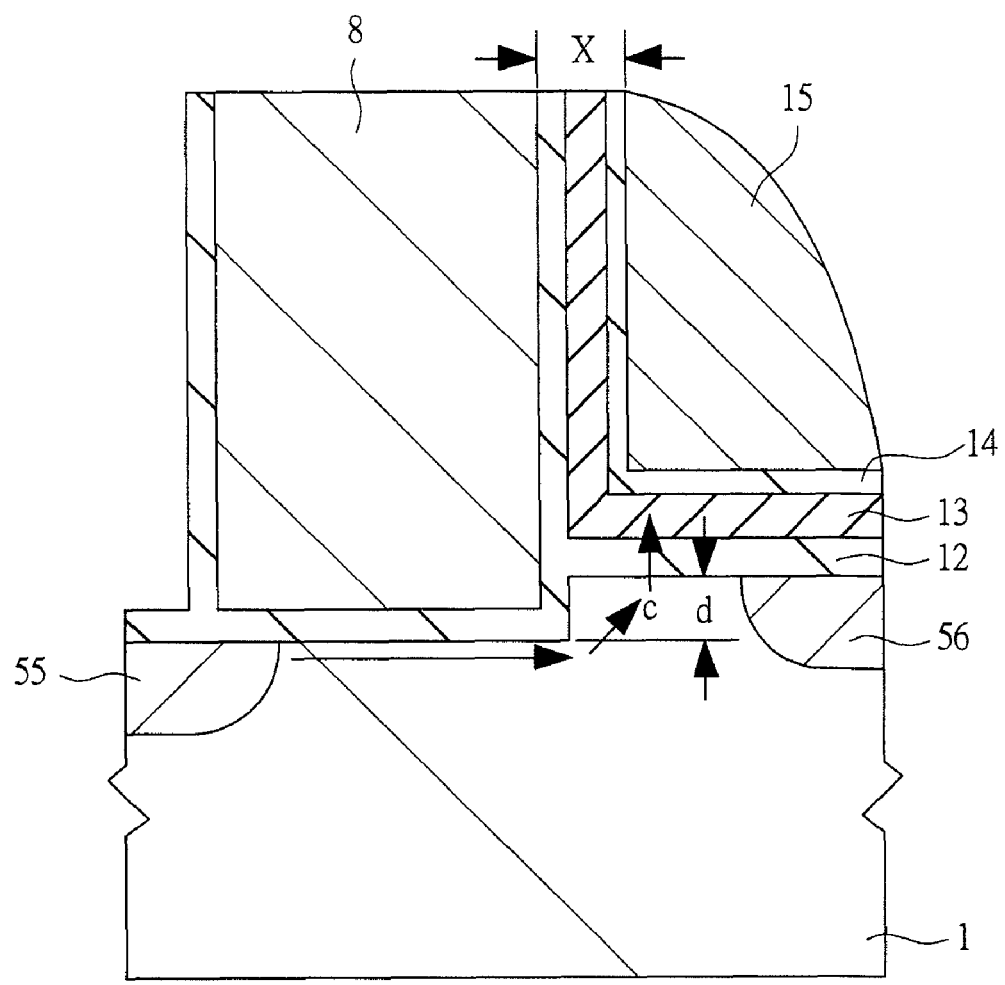
FIG. 2 is a cross-sectional view of a principal part of a semiconductor device of the present invention.
Figure 3:
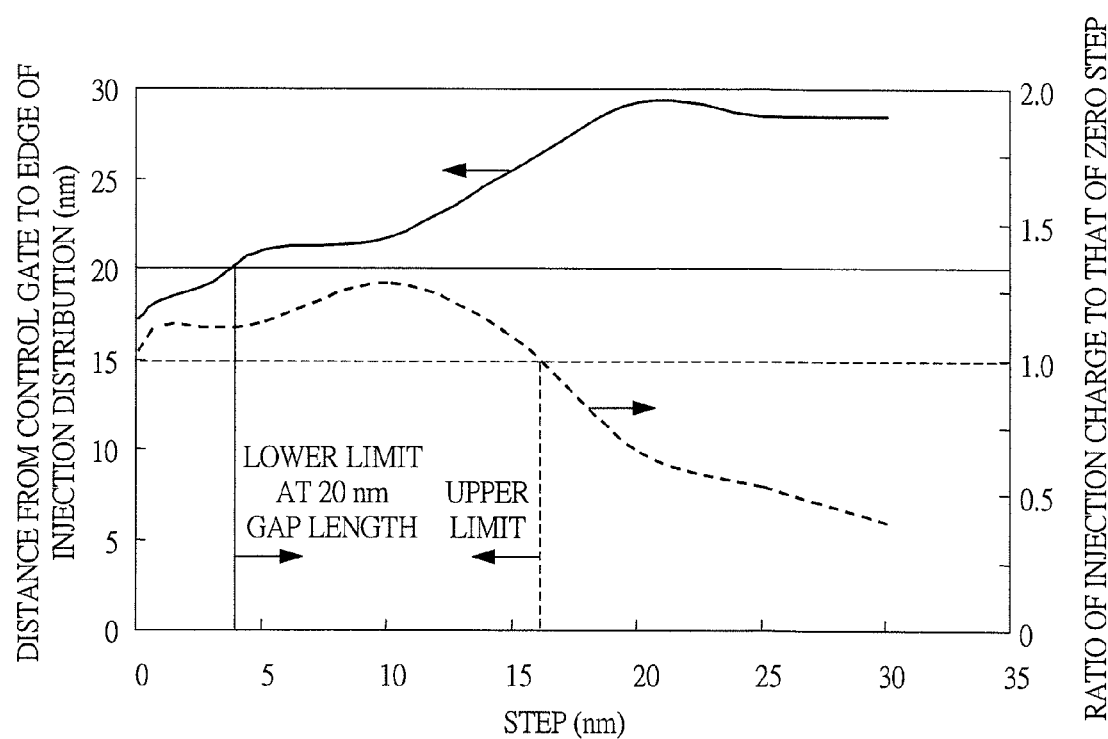
FIG. 3 is a graph illustrating simulation results of a step dependency with respect to an edge position of hot-electron injection and an amount of injection charge.
Figure 4:
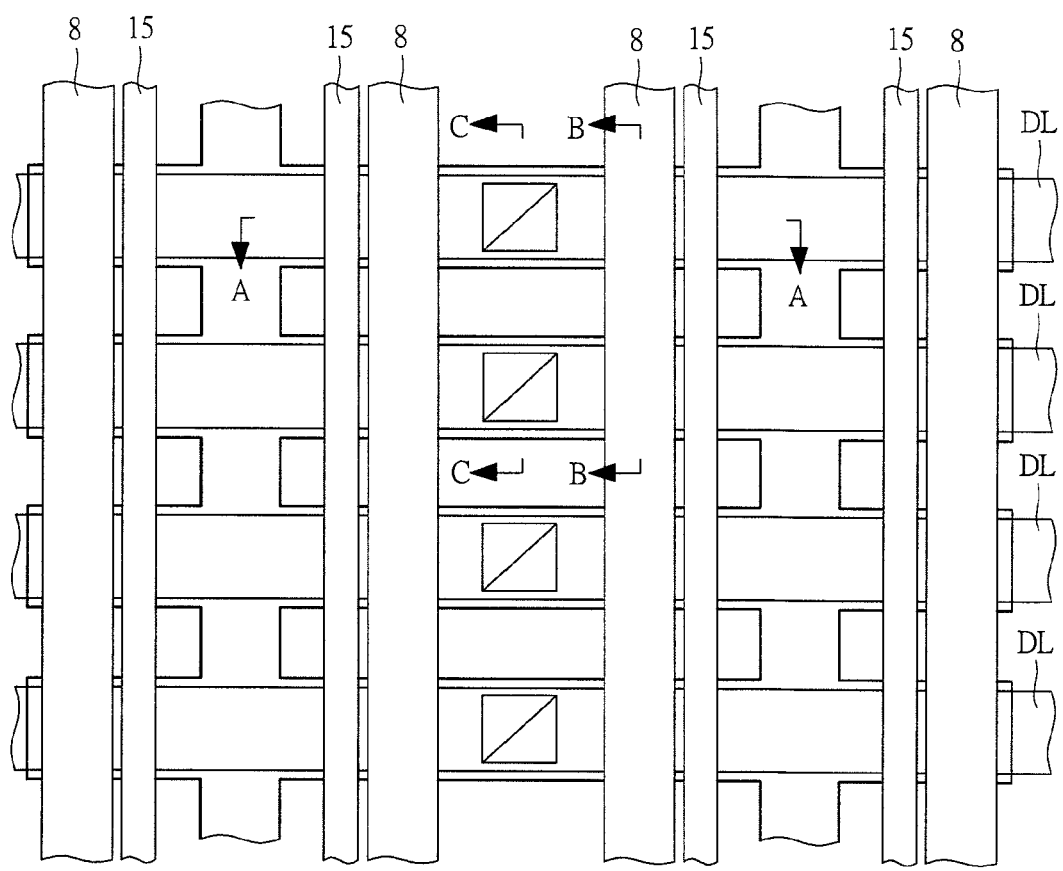
FIG. 4 is a plan view of a principal part illustrating a memory array region of a semiconductor device according to a first embodiment of the present invention.
Figure 5:
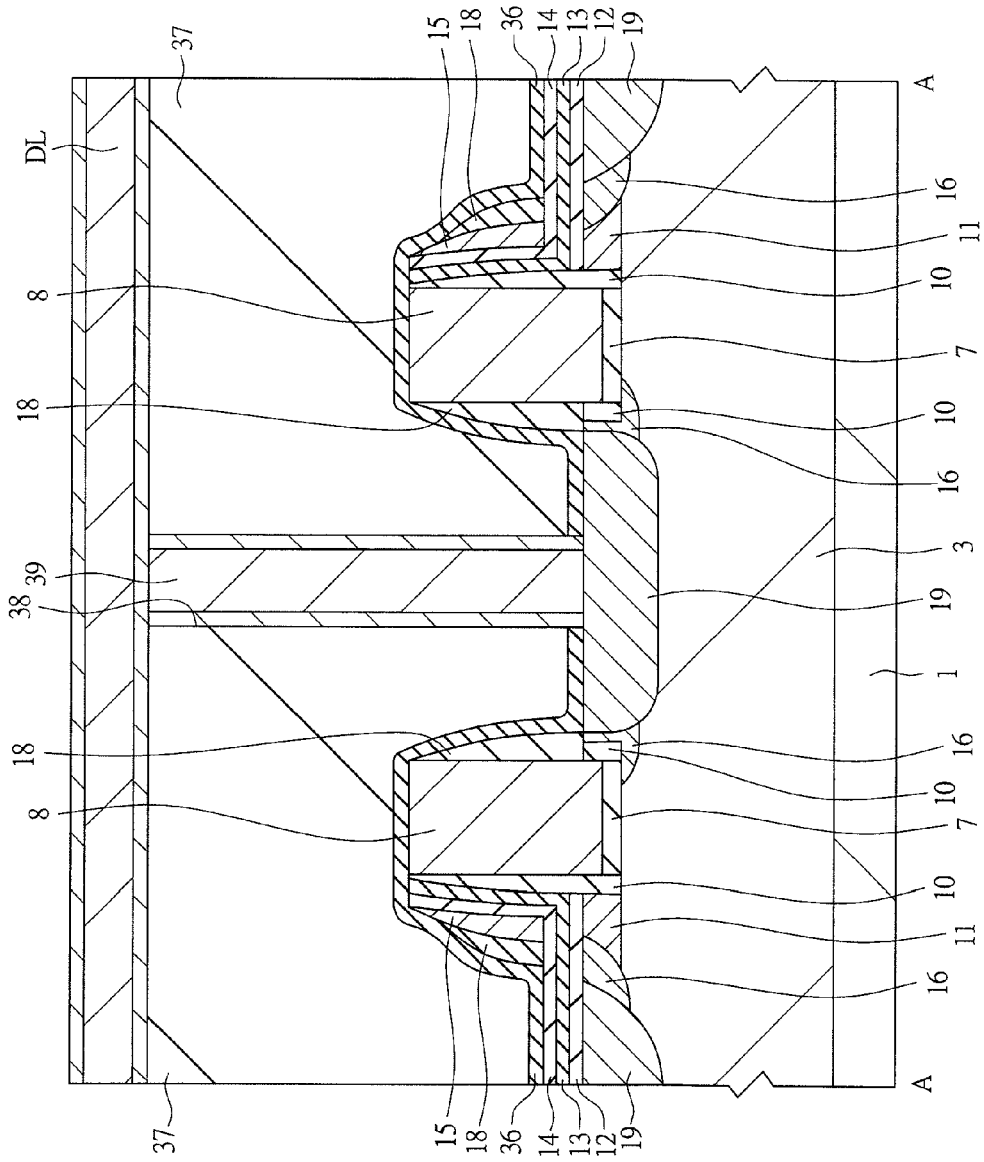
FIG. 5 is a cross-sectional view taken along the line A-A in FIG. 4.

FIG. 4 is a plan view of a principal part illustrating a memory array region of a semiconductor device according to a first embodiment of the present invention, and FIG. 5 is a cross sectional view taken along the line A-A in FIG. 4. Note that, in FIG. 4, illustration of a part of members is omitted to easily see a constitution of the memory array region.

The semiconductor device according to the present embodiment includes a nonvolatile semiconductor storage device having a split-gate memory cell employing a MONOS type. The split-gate memory cell is composed of a select MOS transistor and a memory MOS transistor formed on a p-type well 3 on a p-type silicon substrate 1. A gate electrode (select gate 8) in the select MOS transistor is composed of an n-type polycrystalline silicon film and is formed on a gate insulating film 7 composed of a silicon dioxide film. A gate electrode (memory gate 15) in the memory MOS transistor is composed of an n-type polycrystalline silicon film and is disposed on one sidewall of the select gate 8. Although illustration is omitted, the select gate 8 is connected to a select gate line, and the memory gate 15 is connected to a word line.

The memory gate 15 is electrically isolated from the select gate 8 via a gate insulating film composed of a sidewall spacer 10, a silicon nitride film 13, and a top oxide film 14, and is electrically isolated from the p-type well 3 via a gate insulating film composed of a bottom oxide film 12, the silicon nitride film 13, and the top oxide film 14.

In the p-type well 3 in a vicinity of the select gate 8, an $n^+$-type semiconductor region 19 functioning as a drain region of the memory cell is formed. The $n^+$-type semiconductor region (drain region) 19 is connected to a data line (DL). The data line (DL) is formed on an interlayer insulating film 37 covering the memory cell, and is electrically connected to the $n^+$-type semiconductor region (drain region) 19 via a plug 39 in a contact hole 38. The data line (DL) is composed of a metal film mainly made of aluminum alloy, and the plug 39 is composed of a metal film mainly made of tungsten. On the other hand, in the p-type well 3 in a vicinity of the memory gate 15, an $n^+$-type semiconductor region 19 functioning as a source region of the memory cell is formed. The $n^+$-type semiconductor region (source region) 19 is connected to a common source line.

In the p-type well 3 in a region adjacent to the $n^+$-type semiconductor region (drain region) 19, an $n^-$-type semiconductor region 16 having a lower impurity concentration than that of the $n^+$-type semiconductor region 19 is formed. The $n^-$-type semiconductor region 16 is an extension region for relaxing the high electric field at an end portion of the $n^+$-type semiconductor region (drain region) 19 so that the select MOS transistor has a LDD (Lightly Doped Drain) structure. Also, in the p-type well 3 in a region adjacent to the $n^+$-type semiconductor region (source region) 19, an $n^-$-type semiconductor region 16 having a lower impurity concentration than that of the $n^+$-type semiconductor region 19 is formed. The $n^-$-type semiconductor region 16 is an extension region for relaxing the high electric field at an end portion of the $n^+$-type semiconductor region (source region) 19 so that the memory MOS transistor has a LDD structure. Sidewall spacers 18 composed of a silicon dioxide film are formed on the other sidewall of the select gate 8 and one sidewall of the memory gate 15. These sidewall spacers 18 are used for forming the $n^+$-type semiconductor region (drain region) 19 and the $n^+$-type semiconductor region (source region) 19.

Next, a method of manufacturing the above-described nonvolatile semiconductor storage device will be explained in an order of steps with reference to FIGS. 6 to 21. In each of the drawings explaining the manufacturing method, a leftmost drawing is a cross-sectional view illustrating a part of a peripheral circuit region, a second drawing from the leftmost is a cross-sectional view illustrating a part of the memory array region (region taken along the line A-A in FIG. 4), and third and fourth drawings from the leftmost are a part of the memory array region (regions taken along the line B-B and C-C of FIG. 4), respectively. In the peripheral circuit region of the nonvolatile semiconductor storage device, there are a circuit composed of a low-voltage MOS transistor such as a sense amplifier, a column decoder, and a row decoder and a circuit composed of a high-voltage MOS transistor such as a booster circuit. However, hereinafter, only a method of manufacturing the memory cell and the low-voltage MOS transistor will be explained.

Figure 6:
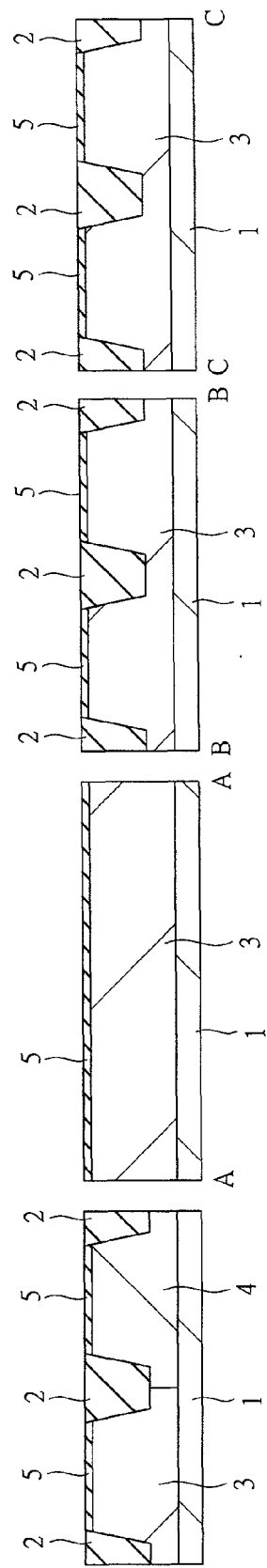
FIG. 6 is cross-sectional views of principal parts illustrating a method of manufacturing the semiconductor device according to the first embodiment of the present invention.

First, as illustrated in FIG. 6, after device-isolation trenches 2 are formed in a main surface of the silicon substrate 1 by using a well-known manufacturing technique, the p-type well 3 and an n-type well 4 are formed in the main surface of the silicon substrate 1. Next, by thermally oxidizing the silicon substrate 1, a gate insulating film 5 made of silicon dioxide having a film thickness of about 3 to 4 nm is formed on a surface of each of the p-type well 3 and the n-type well 4. The gate insulating film 5 becomes the gate insulating film in the MOS transistor constituting the peripheral circuit.

Figure 7:
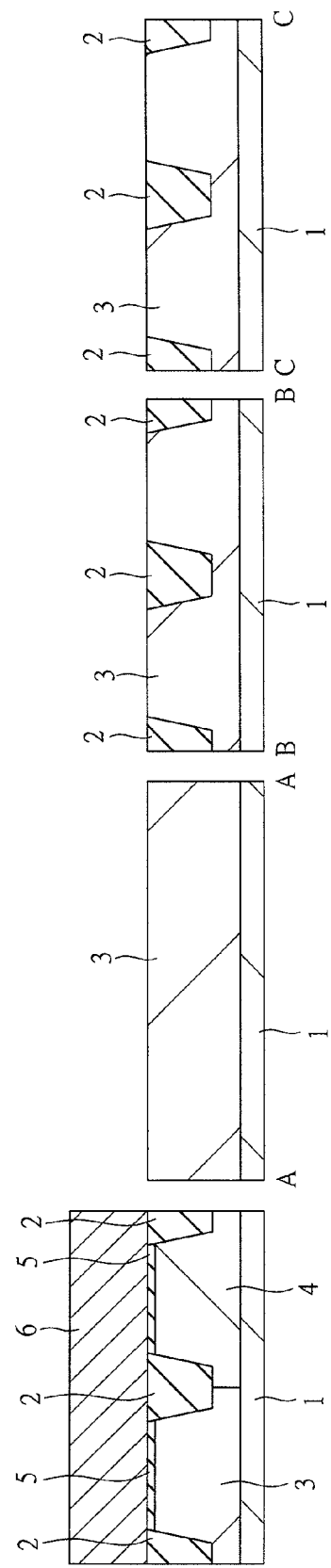
FIG. 7 is cross-sectional views of principal parts illustrating the method of manufacturing the semiconductor device continued from FIG. 6.

Next, as illustrated in FIG. 7, after an undoped polycrystalline silicon film 6 having a film thickness of about 150 nm is deposited on the silicon substrate 1 by a CVD (chemical vapor deposition) method, the undoped polycrystalline silicon film 6 in the memory array region is removed by dry etching with using a photoresist film (not illustrated) as a mask. The undoped polycrystalline silicon film 6 becomes the gate electrode in the MOS transistor constituting the peripheral circuit. Subsequently, in order to adjust a threshold voltage of the select MOS transistor, after the ion implantation, the gate insulating film 5 in the memory array region is removed by using a diluted hydrofluoric acid aqueous solution.

Figure 8:
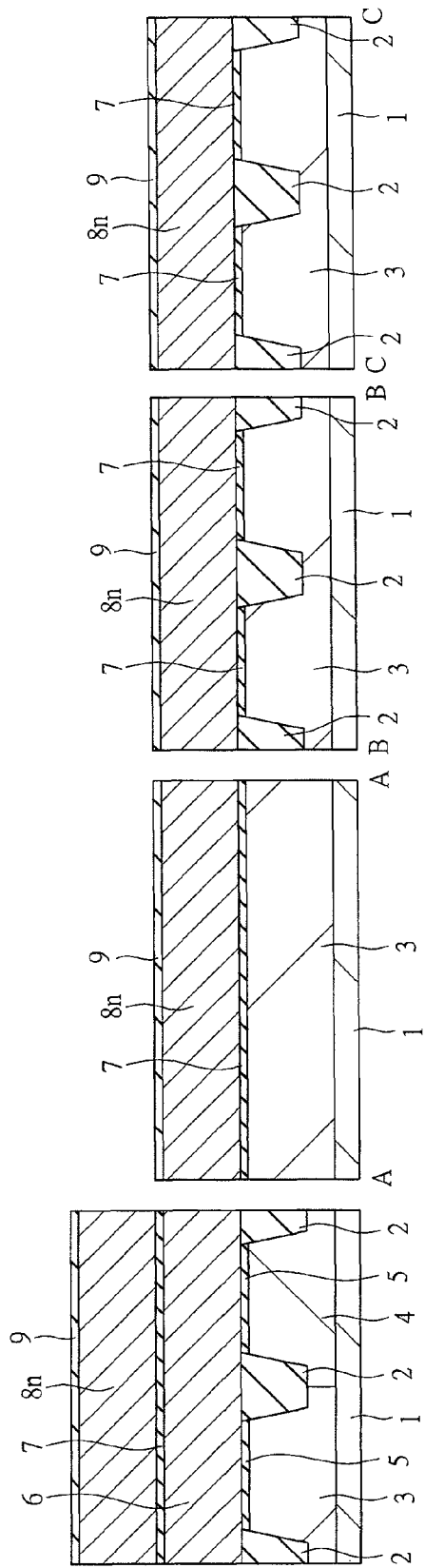
FIG. 8 is cross-sectional views of principal parts illustrating the method of manufacturing the semiconductor device continued from FIG. 7.

Next, as illustrated in FIG. 8, a gate insulating film 7 made of silicon dioxide having a film thickness of about 3 to 4 nm is formed on a surface of the p-type well 3 in the memory array region. The gate insulating film 7 becomes the gate insulating film of the select MOS transistor. Subsequently, a polycrystalline silicon film $8n$ having a film thickness of about 200 nm is deposited on the silicon substrate 1 by a CVD method. Phosphorous is doped into the polycrystalline silicon film $8n$ by about $4 \times 10^{20}$ atoms/cm$^3$ in its film formation so that its conductive type becomes an n type. Next, a silicon nitride film 9 is deposited on the polycrystalline silicon film $8n$ by a CVD method.

Figure 9:
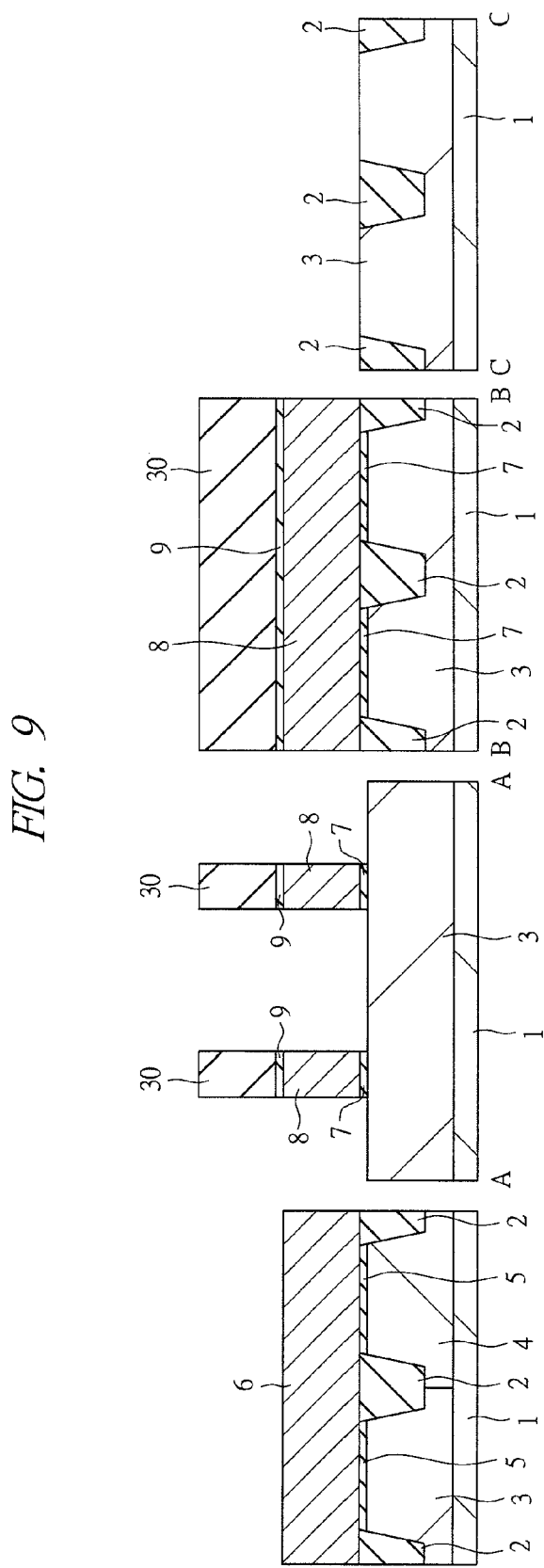
FIG. 9 is cross-sectional views of principal parts illustrating the method of manufacturing the semiconductor device continued from FIG. 8.

Next, as illustrated in FIG. 9, the polycrystalline silicon film $8n$ in the memory array region is patterned by dry etching with using a photoresist film 30 as a mask to form the select gate 8. At this time, all of the polycrystalline silicon film $8n$ in the peripheral circuit region is removed. Subsequently, as substrate cleaning, the surface of the silicon substrate 1 (p-type well 3) is isotropically dry-etched to remove damages of the surface of the silicon substrate 1 caused by the dry etching to the polycrystalline silicon film $8n$.

Figure 10:
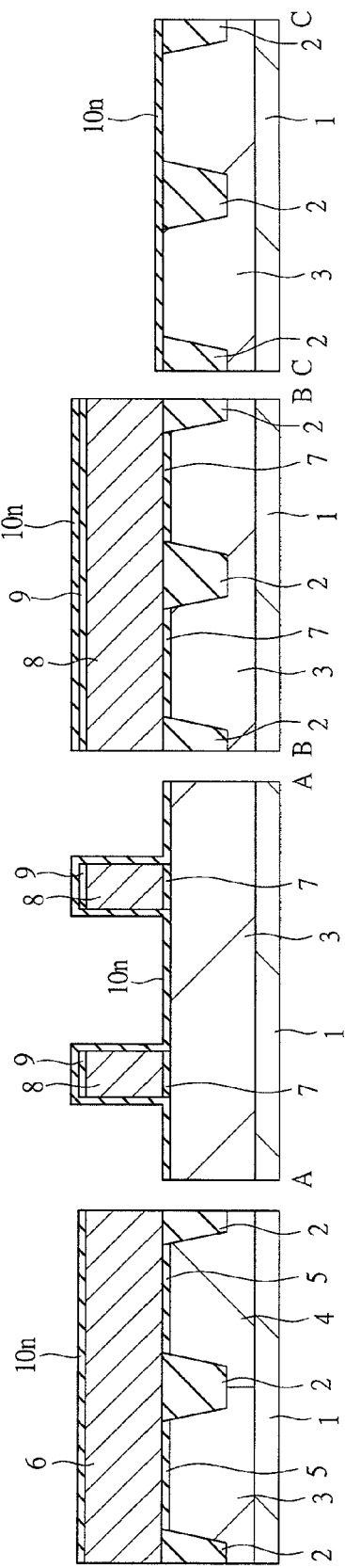
FIG. 10 is cross-sectional views of principal parts illustrating the method of manufacturing the semiconductor device continued from FIG. 9.

Next, as illustrated in FIG. 10, an oxide film $10n$ to be a part of the memory gate insulating film is formed. The oxide film $10n$ is formed by using a thermal oxidation method and a CVD method in combination, and its film thickness is about 2 to 7 nm. As the thermal oxidation method, an ISSG (in-situ steam generation) oxidation method, a dry oxidation method, a wet oxidation method, a plasma oxidation method, or the like can be used. As the CVD method, an atmospheric-pressure CVD method, a low-pressure CVD method, a plasma CVD method, or the like can be used.

Figure 11:
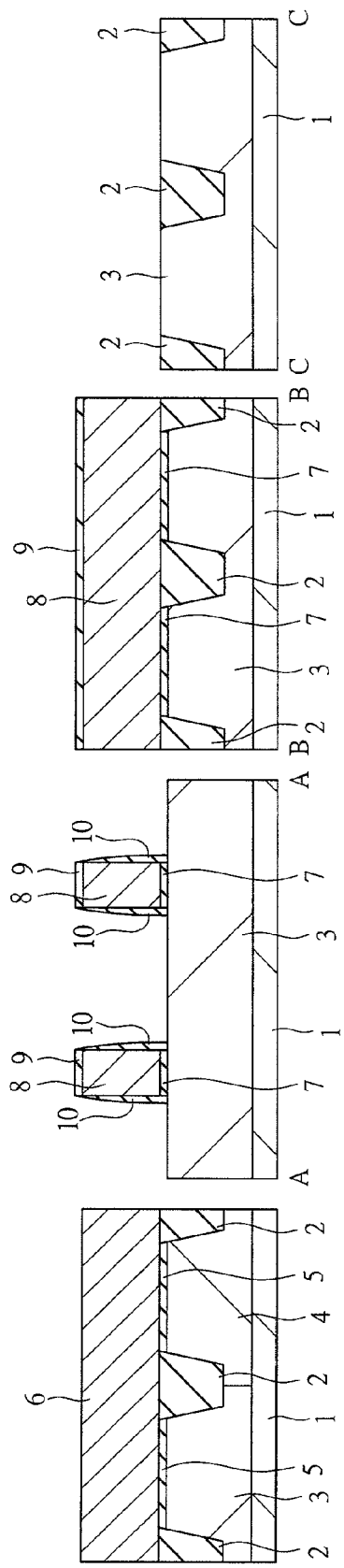
FIG. 11 is cross-sectional views of principal parts illustrating the method of manufacturing the semiconductor device continued from FIG. 10.

Next, as illustrated in FIG. 11, by anisotropically etching the oxide film 10n, the oxide film 10n remains on both sidewalls of the select gate 8 as the sidewall spacer 10, and the oxide film 10n on the surface of the silicon substrate 1 is removed. The sidewall spacer 10 becomes a part of the gate insulating film between the select gate 8 and the memory gate.

Figure 12:
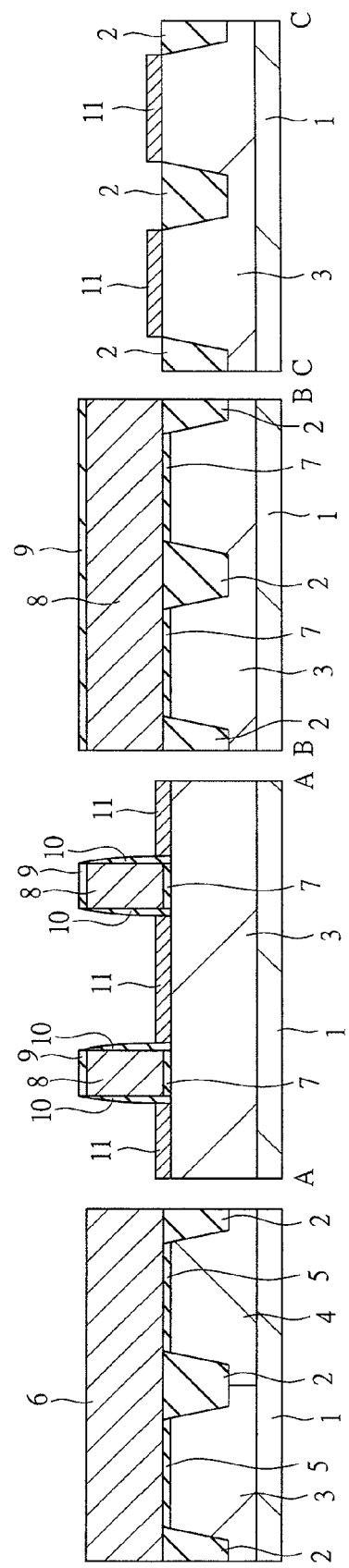
FIG. 12 is cross-sectional views of principal parts illustrating the method of manufacturing the semiconductor device continued from FIG. 11.

Next, as illustrated in FIG. 12, a silicon epitaxial layer 11 is formed on the surface of the silicon substrate 1 (p-type well 3) exposed by the above-described etching. The silicon epitaxial layer 11 is formed by using a CVD method with a dichlorosilane ($SiH_2Cl_2$) as a raw material gas and a mixed gas of hydrogen and hydrogen chloride as a carrier gas under a temperature condition of 600 to 1100° C. A film thickness of the silicon epitaxial layer 11 is set to be a height of a substrate step to be formed.

Figure 13:
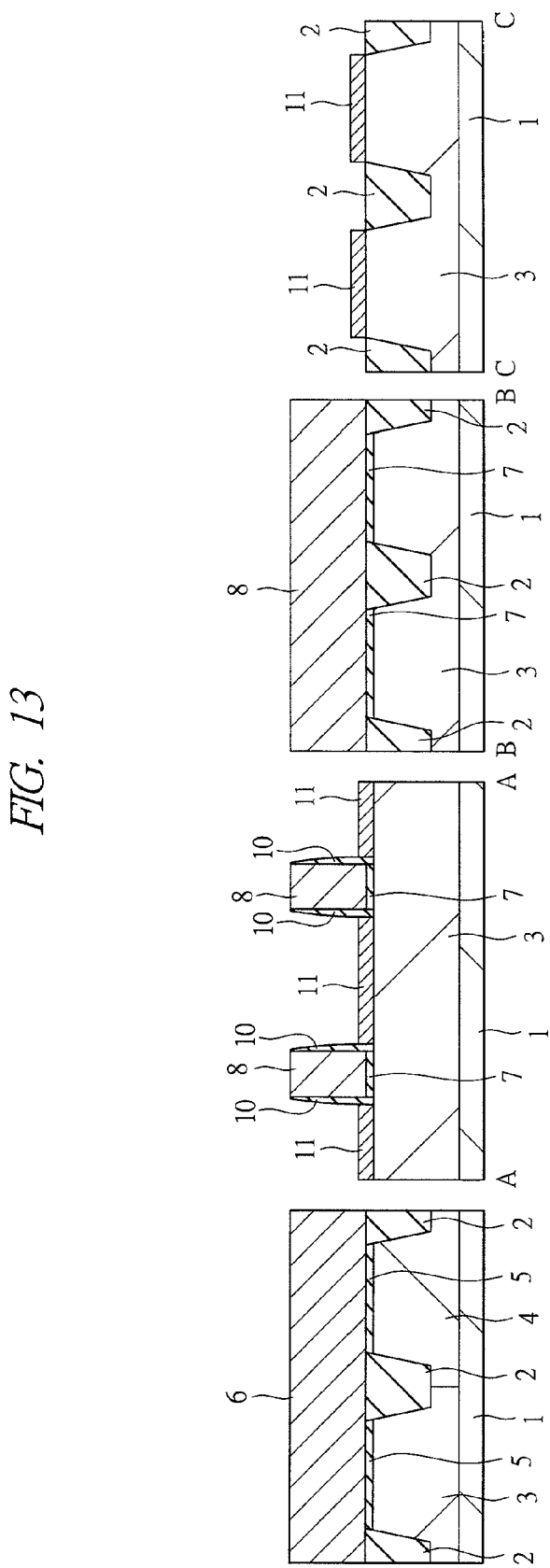
FIG. 13 is cross-sectional views of principal parts illustrating the method of manufacturing the semiconductor device continued from FIG. 12.

Next, as illustrated in FIG. 13, the silicon nitride film 9 is removed.

Figure 14:
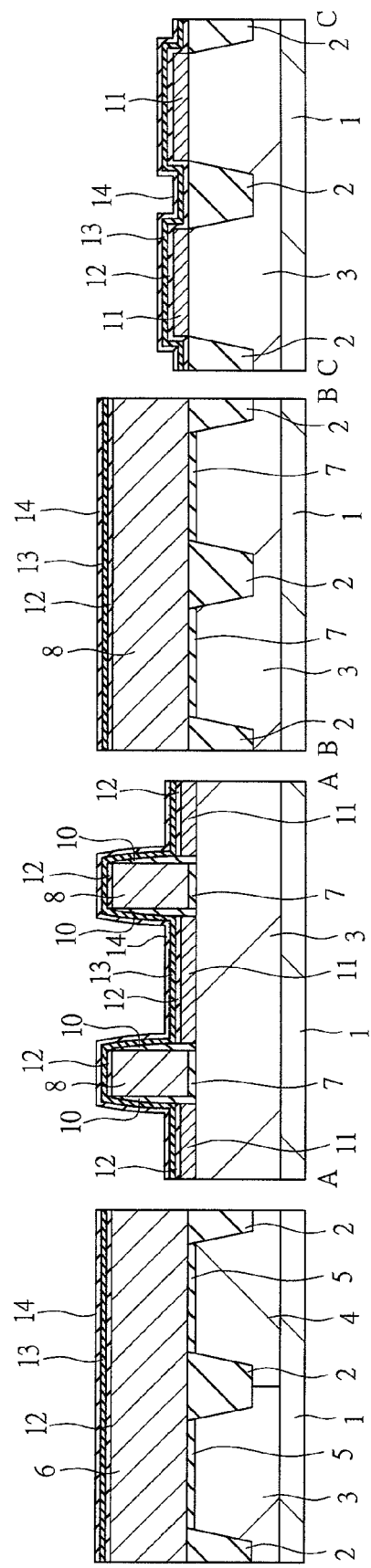
FIG. 14 is cross-sectional views of principal parts illustrating the method of manufacturing the semiconductor device continued from FIG. 13.

Next, as illustrated in FIG. 14, the bottom oxide film 12 to be a part of the gate insulating film is formed on the silicon epitaxial layer 11 and the select gate 8. The bottom oxide film 12 is formed by using a CVD method. Its film thickness is about 2 to 7 nm. Next, the silicon nitride film 13 to be the gate insulating film is formed. The silicon nitride film 13 is formed by, for example, a thermal CVD method with dichlorosilane ($SiH_2Cl_2$) and ammonia ($NH_3$) as raw materials at about 800° C., and its film thickness is about 13 to 15 nm. The film thickness of the silicon nitride film 13 is adequately determined in accordance with requirements for reduction of the operation voltage and improvement of the retention characteristics. Further, the top oxide film 14 to be a part of the gate insulating film is formed. The top oxide film 14 is formed by oxidizing a part of the silicon nitride film 13 by using an ISSG oxidation method, and its film thickness is about 4 to 6 nm. The top oxide film 14 can be also formed by using the dry oxidation method, the wet oxidation method, the plasma oxidation method, or the like instead of the ISSG oxidation method. Also, the top oxide film 14 can be formed by depositing a silicon oxide film by the CVD method. Note that, as a matter of course, the present invention can be employed to a case that the top oxide film 14 is eliminated and the gate insulating film is constituted by the bottom oxide film 12 and the silicon nitride film 13.

Figure 15:
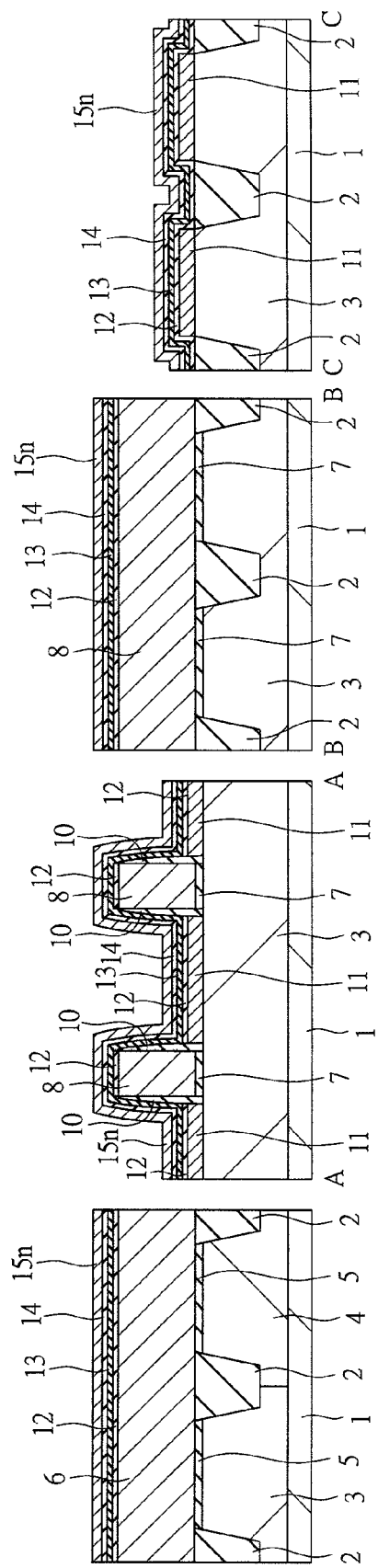
FIG. 15 is cross-sectional views of principal parts illustrating the method of manufacturing the semiconductor device continued from FIG. 14.

Next, as illustrated in FIG. 15, a polycrystalline silicon film 15n is deposited on the silicon substrate 1 by a CVD method. Phosphorous is doped into the polycrystalline silicon film 15n by about $4 \times 10^{20}$ atoms/cm$^3$ in its film formation so that its conductive type becomes an n type.

Figure 16:
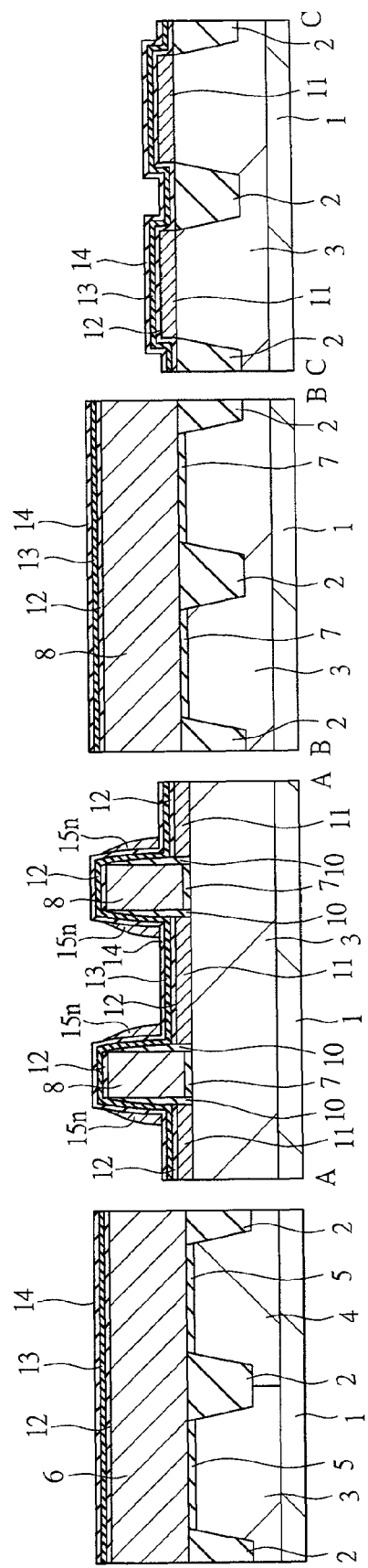
FIG. 16 is cross-sectional views of principal parts illustrating the method of manufacturing the semiconductor device continued from FIG. 15.

Next, the memory gate 15 is formed on the one sidewall of the select gate 8. In order to form the memory gate 15, as illustrated in FIG. 16, the polycrystalline silicon film 15n is anisotropically etched, so that the polycrystalline silicon film 15n remains on both sidewalls of the select gate 8. The channel length of the memory MOS transistor is defined by a film thickness of the polycrystalline silicon film 15n. In the present embodiment, the film thickness of the polycrystalline silicon film 15n is set to be about 60 nm, so that the channel length of the memory MOS transistor is set to be about 60 nm.

Figure 17:
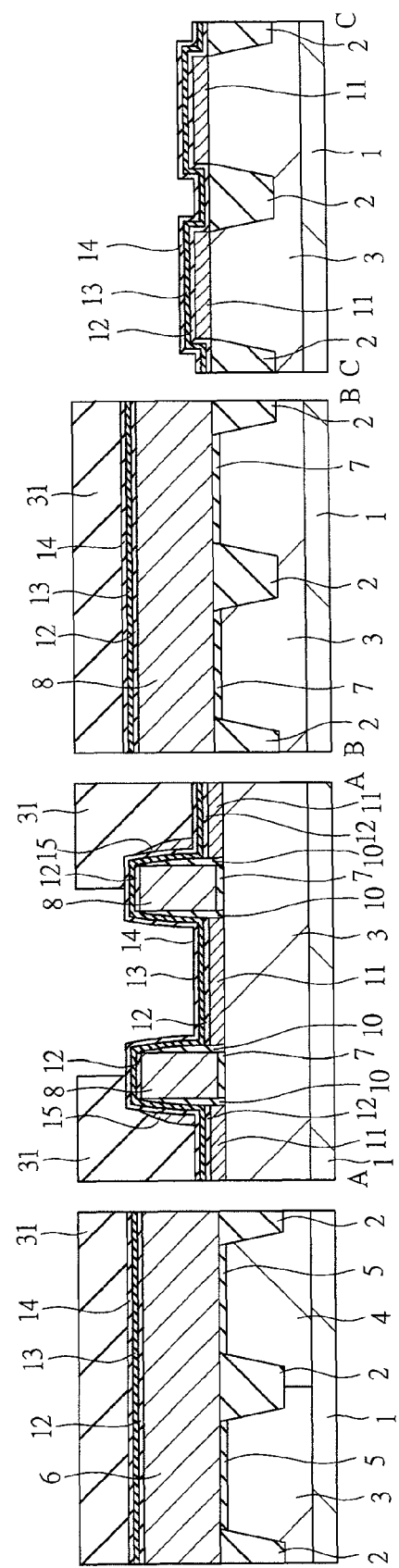
FIG. 17 is cross-sectional views of principal parts illustrating the method of manufacturing the semiconductor device continued from FIG. 16.

Next, as illustrated in FIG. 17, the n-type polycrystalline silicon film 15n on the other sidewall of the select gate 8 is etched with using a photoresist film 31 as a mask, so that the memory gate 15 composed of the n-type polycrystalline silicon film 15n is formed on the one sidewall of the select gate 8.

Figure 18:
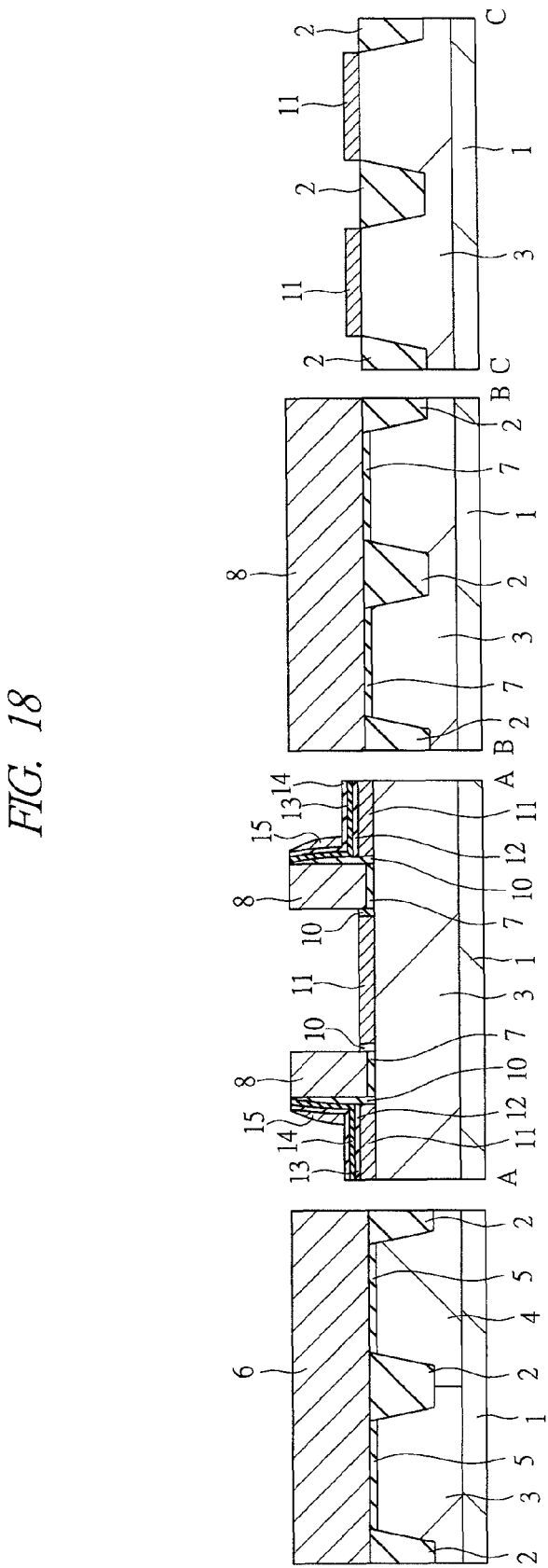
FIG. 18 is cross-sectional views of principal parts illustrating the method of manufacturing the semiconductor device continued from FIG. 17.

Next, as illustrated in FIG. 18, after the triple-layer insulating film constituting the gate insulating film is etched by using hydrofluoric acid and phosphoric acid, the photoresist film 31 is removed. In this manner, the gate insulating film remains only in peripheral regions covered by the memory gate 15 (regions on the one sidewall of the select gate 8 and below the memory gate 15), and the gate insulating film in the other region is removed.

Figure 19:
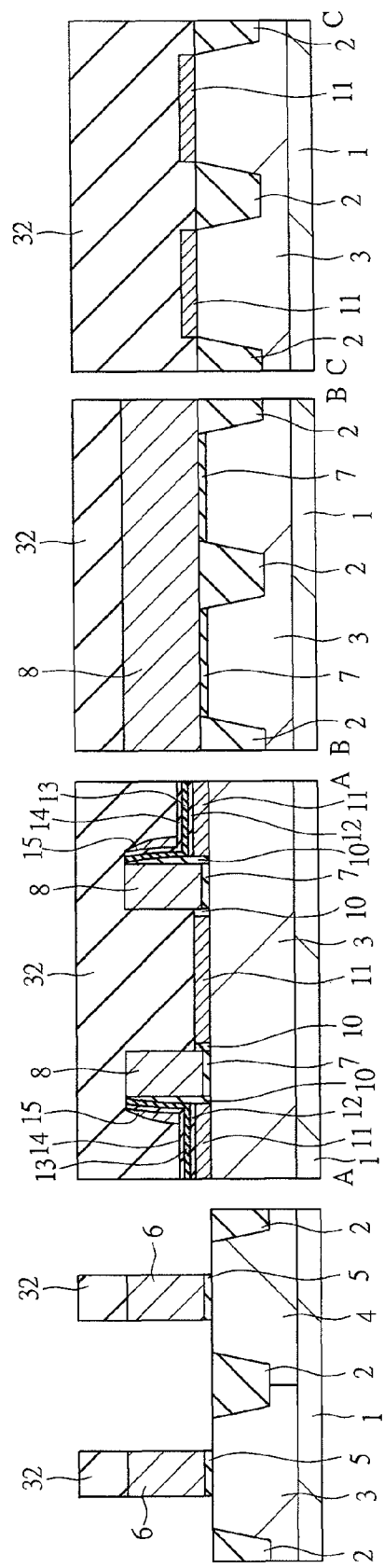
FIG. 19 is cross-sectional views of principal parts illustrating the method of manufacturing the semiconductor device continued from FIG. 18.

Next, as illustrated in FIG. 19, after the undoped polycrystalline silicon film 6 in the peripheral circuit region is patterned by dry etching with using a photoresist film 32 as a mask, the gate insulating film 5 is etched by using a diluted hydrofluoric acid aqueous solution, so that the gate insulating film 5 remains only below the undoped polycrystalline silicon film 6.

Figure 20:
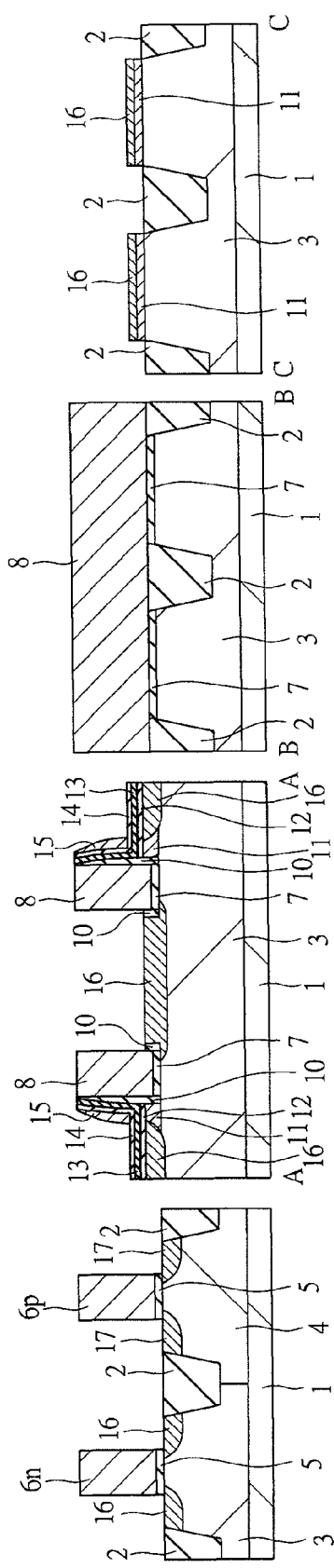
FIG. 20 is cross-sectional views of principal parts illustrating the method of manufacturing the semiconductor device continued from FIG. 19.

Next, as illustrated in FIG. 20, after the photoresist film 32 is removed, phosphorous is ion-implanted into the p-type well 3 in the memory array region and the p-type well 3 in the peripheral circuit region, so that the n⁻-type semiconductor regions 16 are formed in the p-type well 3 in the memory array region and the p-type well 3 in the peripheral circuit region. Also, a gate electrode 6n is formed on the p-type well 3 in the peripheral circuit region. Further, boron is ion-implanted into the n-type well 4, so that p⁻-type semiconductor regions 17 and a gate electrode 6p are formed.

Figure 21:
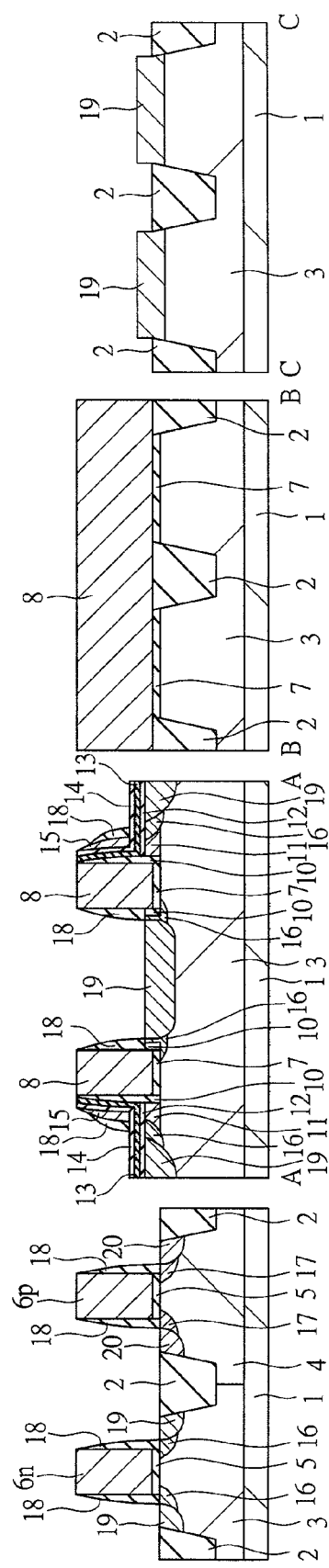
FIG. 21 is cross-sectional views of principal parts illustrating the method of manufacturing the semiconductor device continued from FIG. 20.

Next, as illustrated in FIG. 21, the sidewall spacer 18 is formed on the one sidewall of each of the select gate 8 and the memory gate 15 formed in the memory array region, and the sidewall spacer 18 is formed on both sidewalls of each of the gate electrodes 6n and 6p in the peripheral circuit region. The sidewall spacers 18 are formed by anisotropically etching the silicon dioxide film deposited on the silicon substrate 1 by a CVD method. Subsequently, phosphorous is ion-implanted into the p-type well 3 in the memory array region and the p-type well 3 in the peripheral circuit region, and boron is ion-implanted into the n-type well 4, and then, the silicon substrate 1 is subjected to thermal treatment to diffuse the above-described impurities, so that n⁺-type semiconductor regions (source/drain regions) 19 and p⁺-type semiconductor regions (source/drain regions) 20 are formed. By the steps up to here, the split-gate memory cells of the MONOS type are formed in the memory array region, and n-channel type and p-channel type MOS transistors are formed in the peripheral circuit region.

And then, an etching stopper film 36 composed of a silicon nitride film and an interlayer insulating film 37 composed of a silicon dioxide film are deposited on the silicon substrate 1. Subsequently, a contact hole 38 is formed in the etching stopper film 36 and the interlayer insulating film 37, and the plug 39 is buried inside the contact hole 38, and then, the data line DL is formed on the interlayer insulating film 37, so that the above-described nonvolatile semiconductor storage device illustrated in FIGS. 4 to 5 is completed.

Second Embodiment

Figure 22:
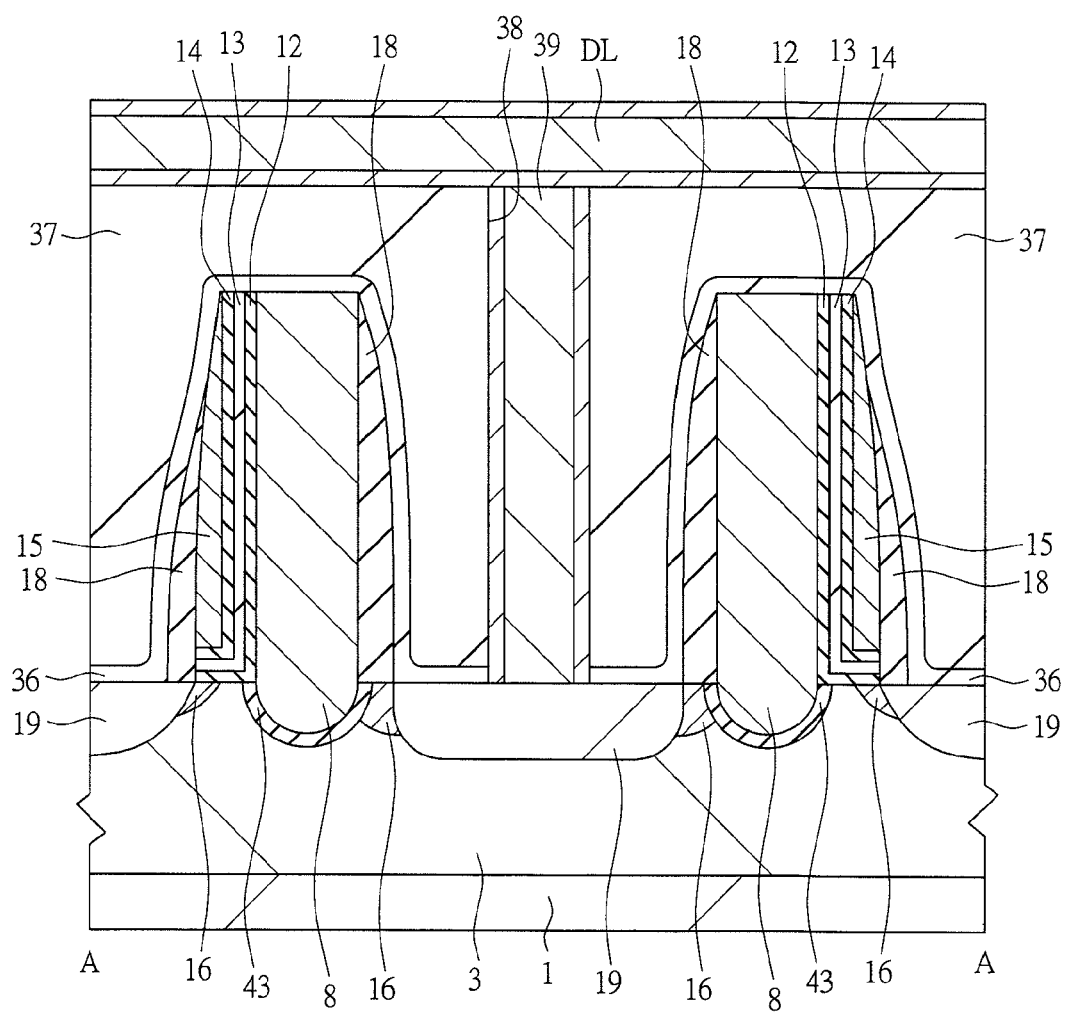
FIG. 22 is cross-sectional views of principal parts illustrating a method of manufacturing a semiconductor device according to a second embodiment of the present invention.

FIG. 22 is a cross-sectional view of a principal part of a nonvolatile semiconductor storage device according to a second embodiment of the present invention. Hereinafter, a method of manufacturing the nonvolatile semiconductor storage device will be explained in an order of steps with reference to FIGS. 23 to 40.

Figure 23:
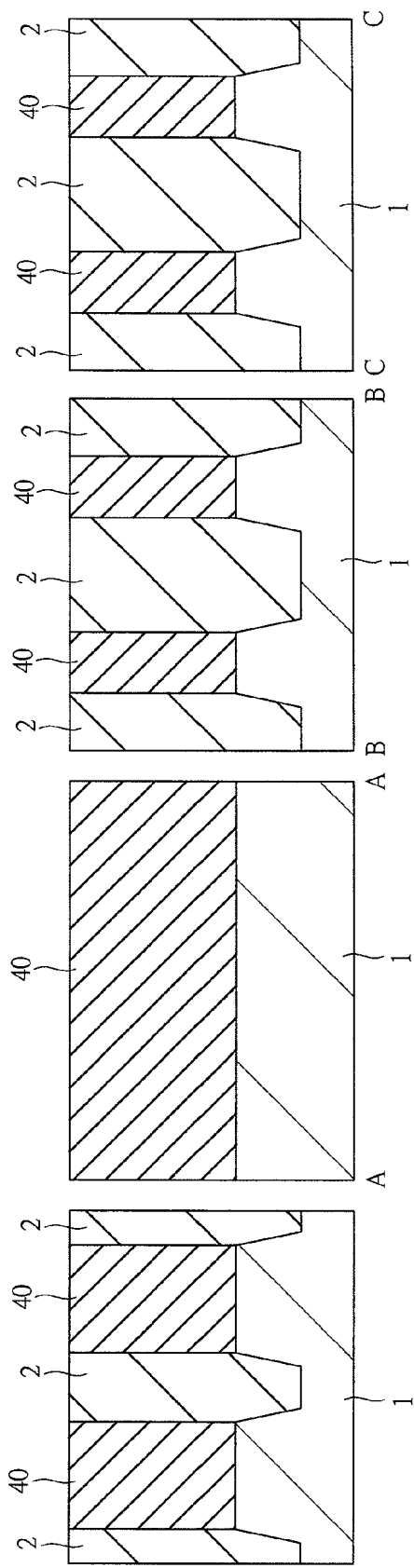
FIG. 23 is cross-sectional views of principal parts illustrating the method of manufacturing the semiconductor device continued from FIG. 22.

First, as illustrated in FIG. 23, a surface of a silicon substrate 1 is etched by a well-known manufacturing technique with using a silicon nitride film 40 as a mask to form device-isolation trenches 2 on a main surface of the silicon substrate 1.

Figure 24:
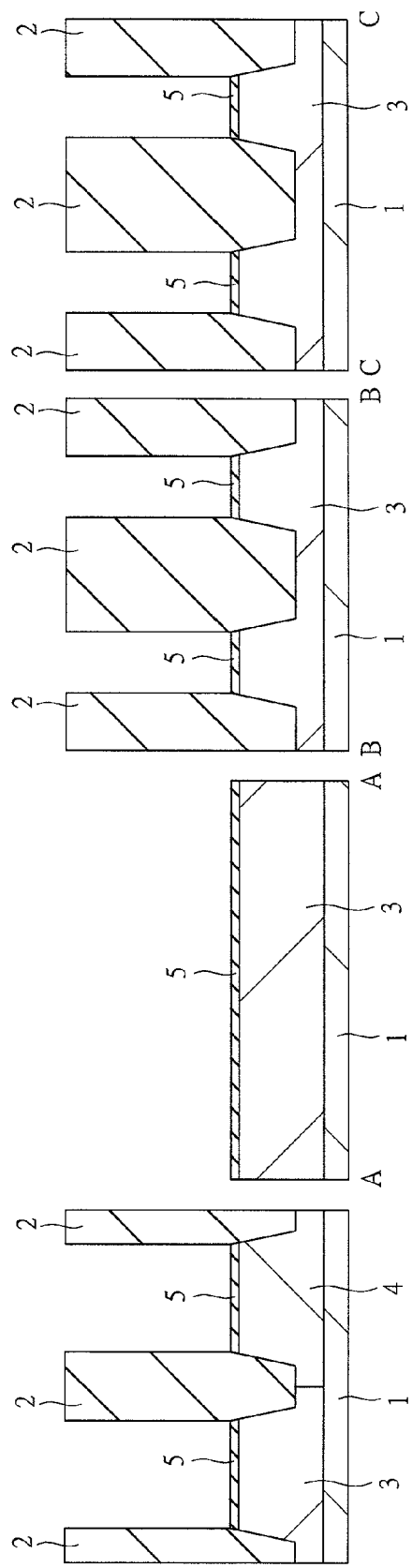
FIG. 24 is cross-sectional views of principal parts illustrating the method of manufacturing the semiconductor device continued from FIG. 23.

Next, as illustrated in FIG. 24, the silicon nitride film 40 is removed, and a p-type well 3 and an n-type well 4 are formed on the main surface of the silicon substrate 1. At this time, the device-isolation trenches 2 are not polished by a CMP (chemical mechanical polishing) method, and still remain. Next, the silicon substrate 1 is thermally oxidized, so that a gate insulating film 5 made of silicon dioxide having a film thickness of about 3 to 4 nm is formed on surfaces of the p-type well 3 and the n-type well 4. The gate insulating film 5 becomes a gate insulating film in a MOS transistor constituting a peripheral circuit.

Figure 25:
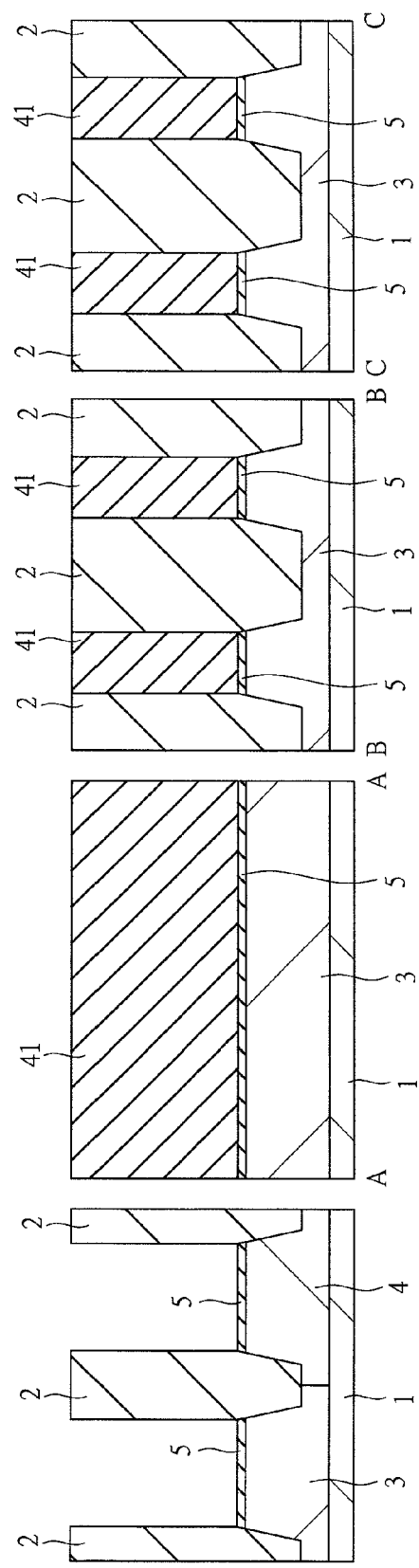
FIG. 25 is cross-sectional views of principal parts illustrating the method of manufacturing the semiconductor device continued from FIG. 24.

Next, as illustrated in FIG. 25, a silicon nitride film 41 is deposited only in a memory array region. The silicon nitride film 41 is formed by, for example, a thermal CVD method with using dichlorosilane ($SiH_2Cl_2$) and ammonia ($NH_3$) as raw materials at about 800° C.

Figure 26:
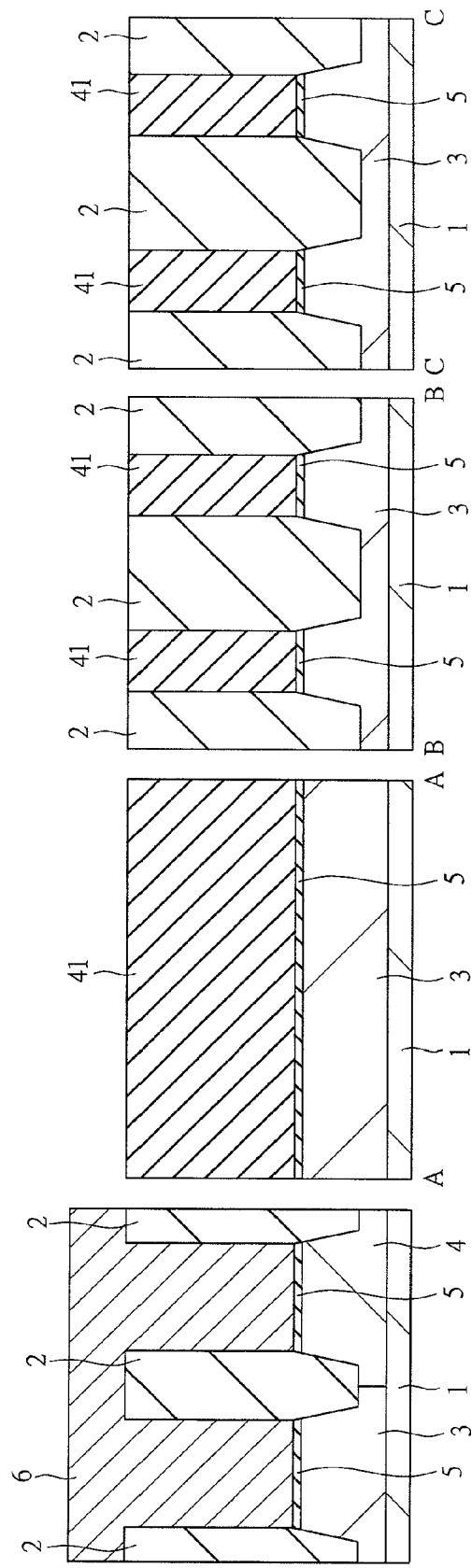
FIG. 26 is cross-sectional views of principal parts illustrating the method of manufacturing the semiconductor device continued from FIG. 25.

Next, as illustrated in FIG. 26, an undoped polycrystalline silicon film 6 having a film thickness of about 150 nm is deposited on the silicon substrate 1 by a CVD method, and the undoped polycrystalline silicon film 6 in the memory array region is removed by dry etching with using a photoresist film (not illustrated) as a mask. The undoped polycrystalline silicon film 6 becomes a gate electrode in the MOS transistors constituting the peripheral circuit.

Figure 27:
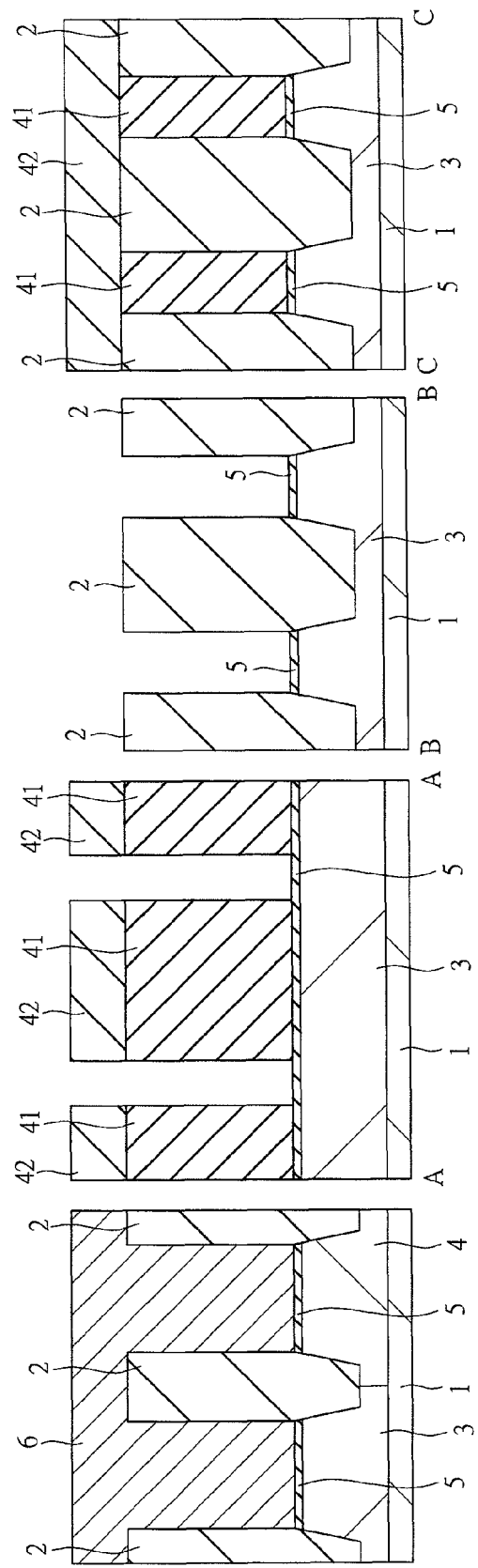
FIG. 27 is cross-sectional views of principal parts illustrating the method of manufacturing the semiconductor device continued from FIG. 26.

Next, as illustrated in FIG. 27, the silicon nitride film 41 in the memory array region is removed by dry etching with using a photoresist film 42 as a mask.

Figure 28:
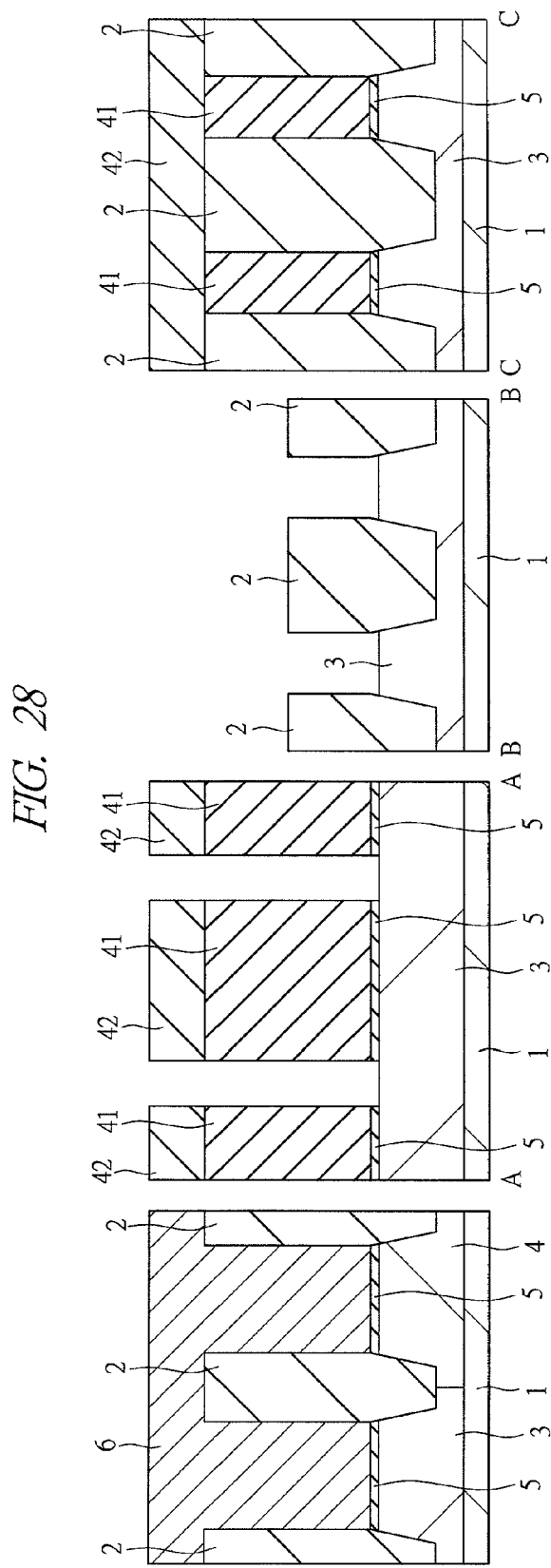
FIG. 28 is cross-sectional views of principal parts illustrating the method of manufacturing the semiconductor device continued from FIG. 27.

Next, as illustrated in FIG. 28, a part of the device-isolation trenches 2 is removed by dry etching. At this time, the gate insulating film 5 in a control-gate portion is also removed.

Figure 29:
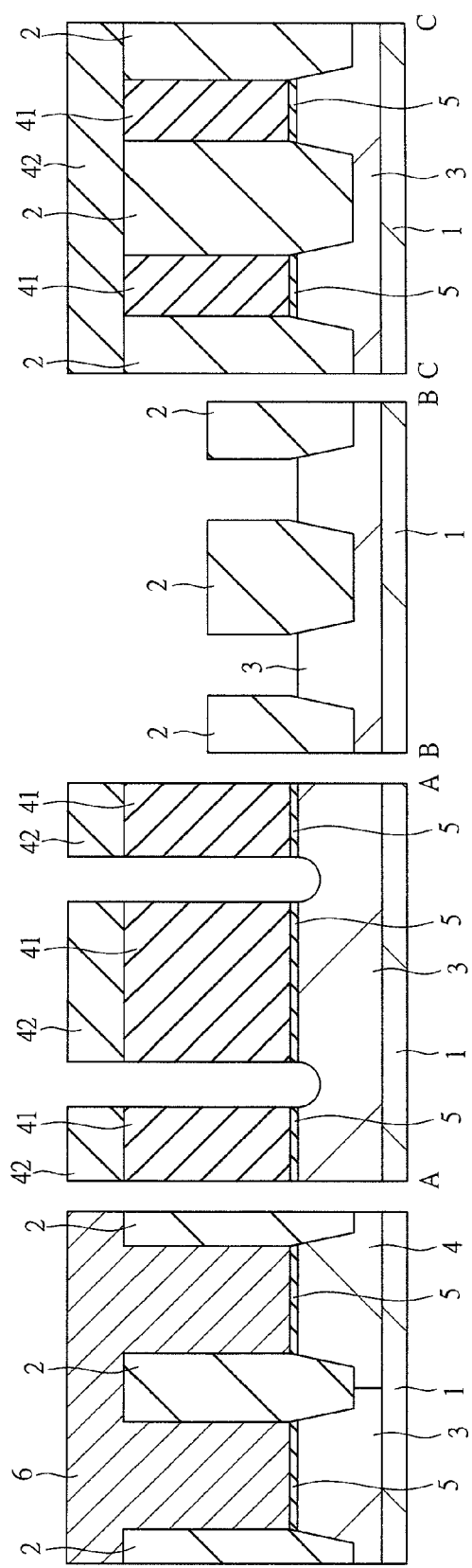
FIG. 29 is cross-sectional views of principal parts illustrating the method of manufacturing the semiconductor device continued from FIG. 28.

Next, as illustrated in FIG. 29, trenches are formed on the silicon substrate 1 by dry etching also with using the photoresist film 42 as a mask. A depth of the trench is a height of a substrate step between a control gate and a memory gate to be formed.

Figure 30:
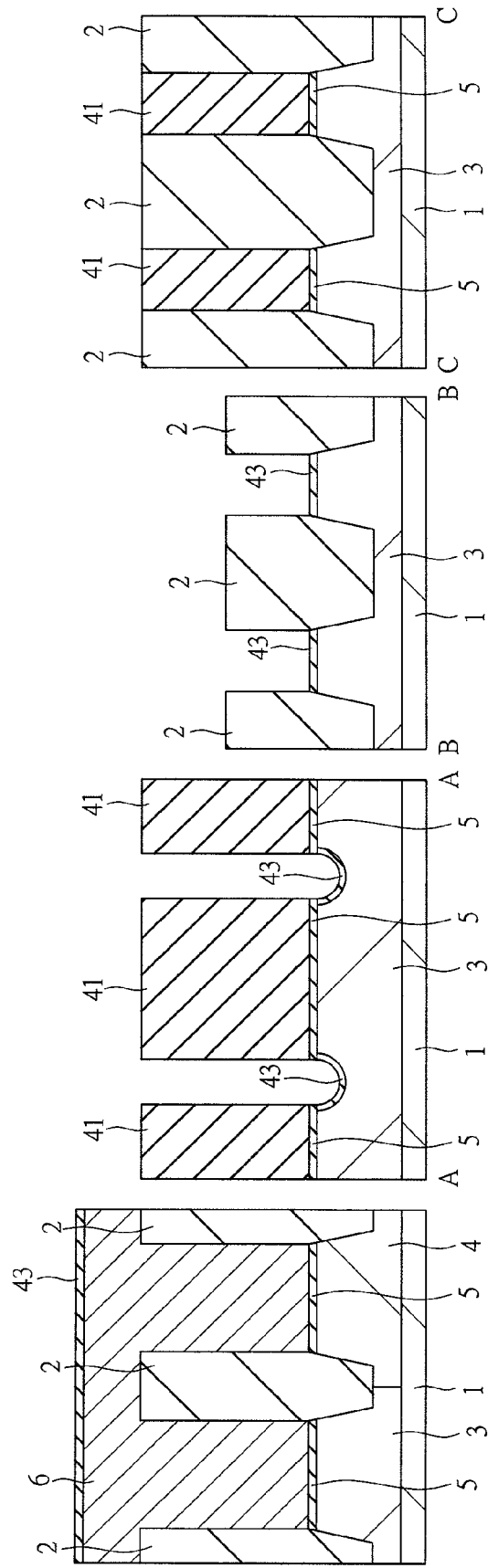
FIG. 30 is cross-sectional views of principal parts illustrating the method of manufacturing the semiconductor device continued from FIG. 29.

Next, as illustrated in FIG. 30, a bottom oxide film 43 to be a part of the gate insulating film is formed on the silicon substrate 1 and the undoped polycrystalline silicon film 6. The bottom oxide film 43 is formed by using a thermal CVD method. Its film thickness is about 2 to 7 nm. And then, the photoresist film 42 is removed.

Figure 31:
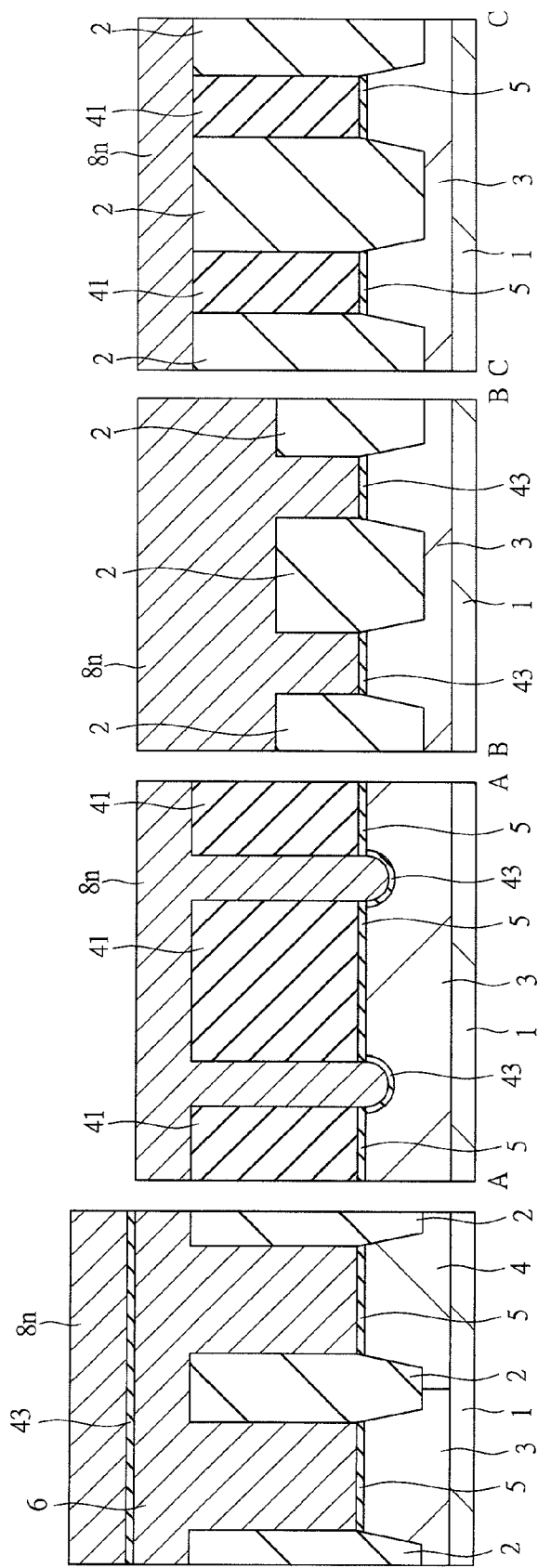
FIG. 31 is cross-sectional views of principal parts illustrating the method of manufacturing the semiconductor device continued from FIG. 30.

Next, as illustrated in FIG. 31, a polycrystalline silicon film 8n having a film thickness of about 200 nm is deposited on the silicon substrate 1 by a CVD method. The polycrystalline silicon film 8n becomes a gate electrode in the select gate.

Figure 32:
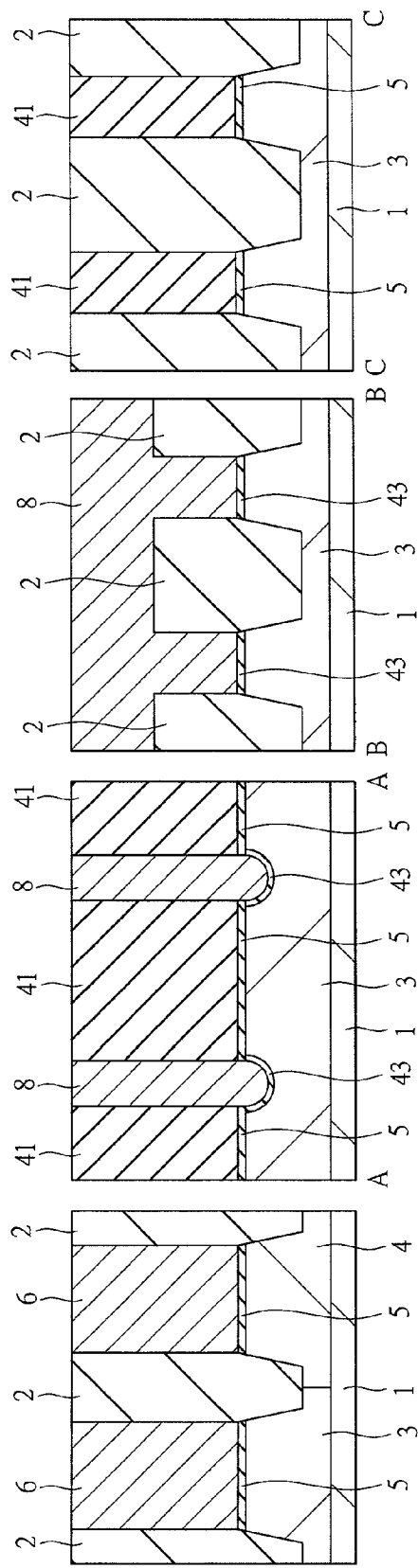
FIG. 32 is cross-sectional views of principal parts illustrating the method of manufacturing the semiconductor device continued from FIG. 31.

Next, as illustrated in FIG. 32, the polycrystalline silicon film 8n, the bottom oxide film 43 of the peripheral MOS region, and the undoped polycrystalline silicon film 6 are polished by a CMP method so that a surface of the silicon nitride film 41 appears to form the select gates 8.

Figure 33:
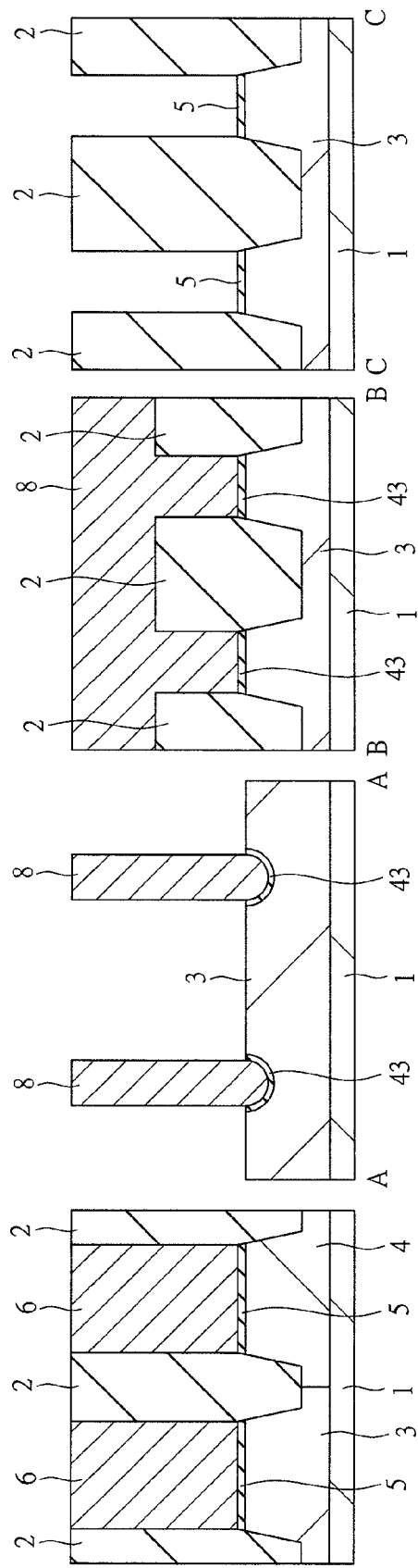
FIG. 33 is cross-sectional views of principal parts illustrating the method of manufacturing the semiconductor device continued from FIG. 32.

Next, as illustrated in FIG. 33, the silicon nitride film 41 is removed.

Figure 34:
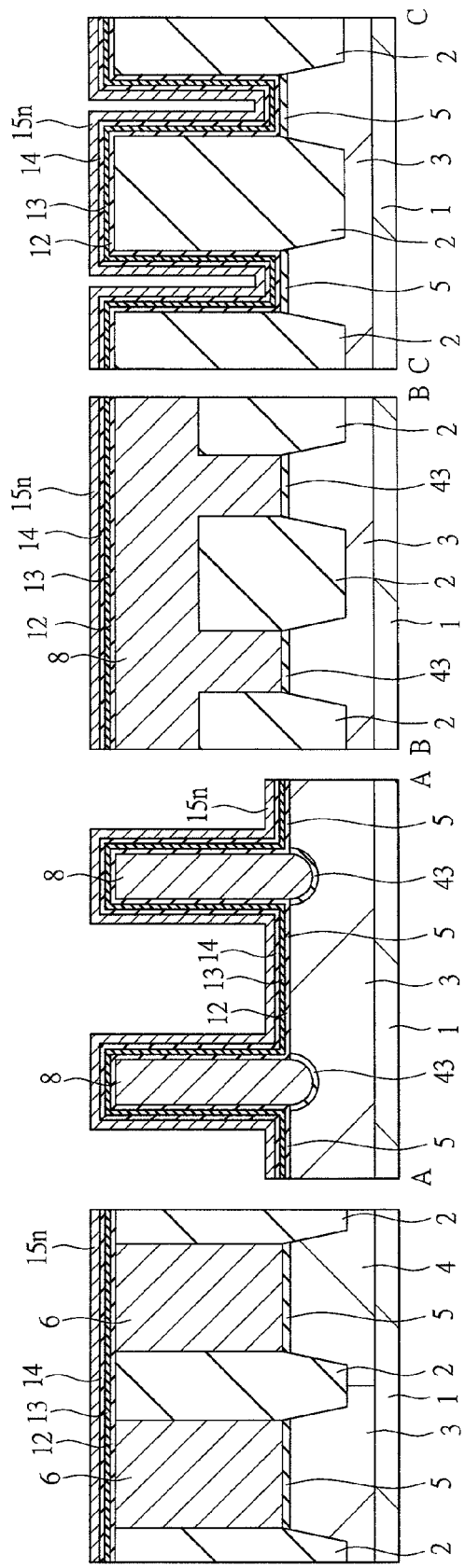
FIG. 34 is cross-sectional views of principal parts illustrating the method of manufacturing the semiconductor device continued from FIG. 33.

Next, as illustrated in FIG. 34, the bottom oxide film 12 to be a part of the gate insulating film is formed on the p-type well 3 and the select gates 8. The bottom oxide film 12 is formed by using a CVD method. Its film thickness is about 2 to 7 nm. Next, the silicon nitride film 13 to be a part (charge-trapping film) of the gate insulating film is formed. The silicon nitride film 13 is formed by, for example, a thermal CVD method using dichlorosilane ($SiH_2Cl_2$) and ammonia ($NH_3$) as raw materials at about 800° C., and its film thickness is about 13 to 15 nm. The film thickness of the silicon nitride film 13 is adequately determined in accordance with requirements for reduction of the operation voltage and improvement of the retention characteristics. Further, after the top oxide film 14 to be a part of the gate insulating film is formed, a polycrystalline silicon film 15n is deposited on the silicon substrate 1 by a CVD method. The top oxide film 14 is formed by oxidizing a part of the silicon nitride film 13 by using an ISSG oxidation method, and its film thickness thereof is about 4 to 6 nm. The top oxide film 14 can be also formed by using a dry oxidation method, a wet oxidation method, a plasma oxidation method, or the like instead of the ISSG oxidation method. Also, the top oxide film 14 can be formed by depositing a silicon oxide film by the CVD method. Note that, as a matter of course, the present invention can be also employed to a case that the top oxide film 14 is eliminated and the gate insulating film is constituted by the bottom oxide film 12 and the silicon nitride film 13.

Figure 35:
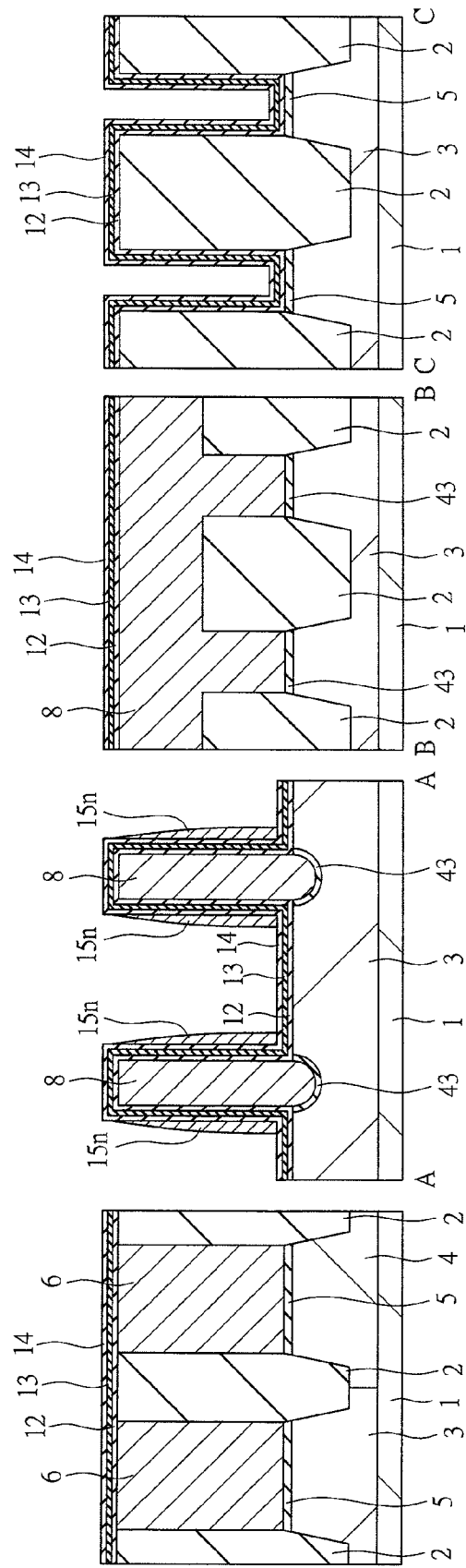
FIG. 35 is cross-sectional views of principal parts illustrating the method of manufacturing the semiconductor device continued from FIG. 34.

Next, a memory gate 15 is formed on one sidewall of the select gate 8. In order to form the memory gate 15, as illustrated in FIG. 35, the polycrystalline silicon film 15n is anisotropically etched, so that the polycrystalline silicon film 15n remains on both sidewalls of the select gate 8. Phosphorous is doped into the polycrystalline silicon film 15n by about $4 \times 10^{20}$ atoms/cm$^3$ in its film formation so that its conductive type becomes an n type. A channel length of the memory MOS transistor is defined by the film thickness of the polycrystalline silicon film 15n. In the present embodiment, the film thickness of the polycrystalline silicon film 15n is set to be about 60 nm, so that the channel length of the memory MOS transistor is set to be about 60 nm.

Figure 36:
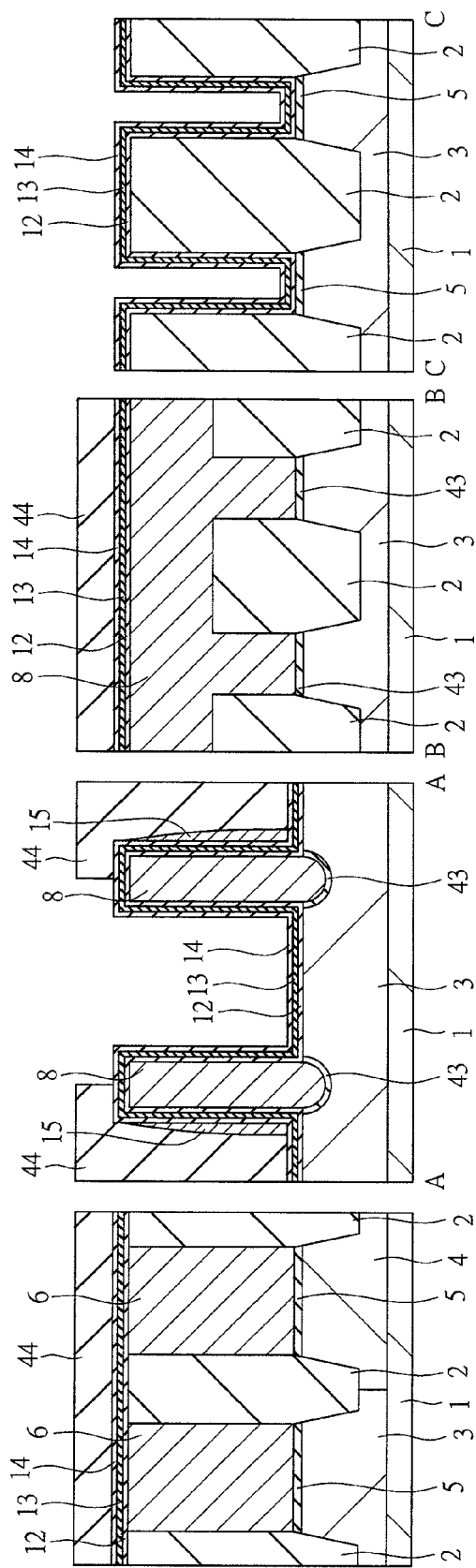
FIG. 36 is cross-sectional views of principal parts illustrating the method of manufacturing the semiconductor device continued from FIG. 35.

Next, as illustrated in FIG. 36, the n-type polycrystalline silicon film 15n on the other sidewall of the select gate 8 is etched with using a photoresist film 44 as a mask, so that the memory gate 15 composed of the n-type polycrystalline silicon film 15n is formed on the one sidewall of the select gate 8.

Figure 37:
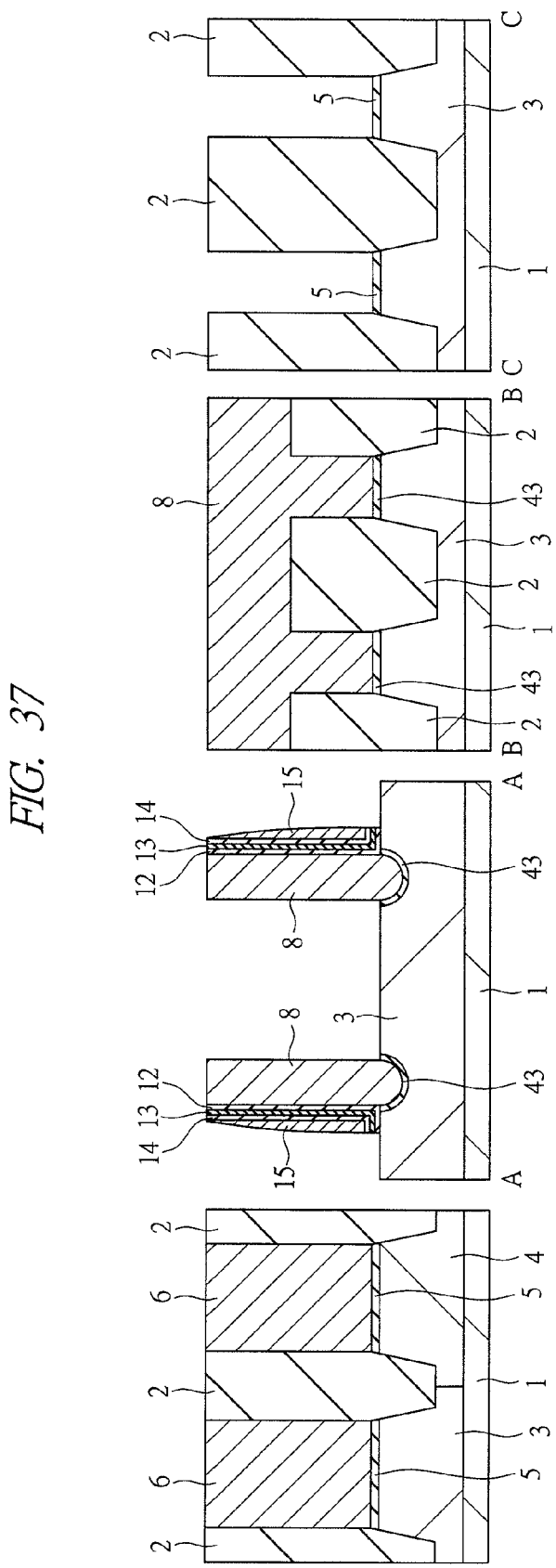
FIG. 37 is cross-sectional views of principal parts illustrating the method of manufacturing the semiconductor device continued from FIG. 36.

Next, as illustrated in FIG. 37, after the triple-layer insulating film constituting the gate insulating film is etched by using hydrofluoric acid and phosphoric acid, the photoresist film 44 is removed. In this manner, the gate insulating film remains only in regions covered by the memory gate 15 (regions on the one sidewall of the select gate 8 and below the memory gate 15), and the gate insulating film in the other region is removed.

Figure 38:
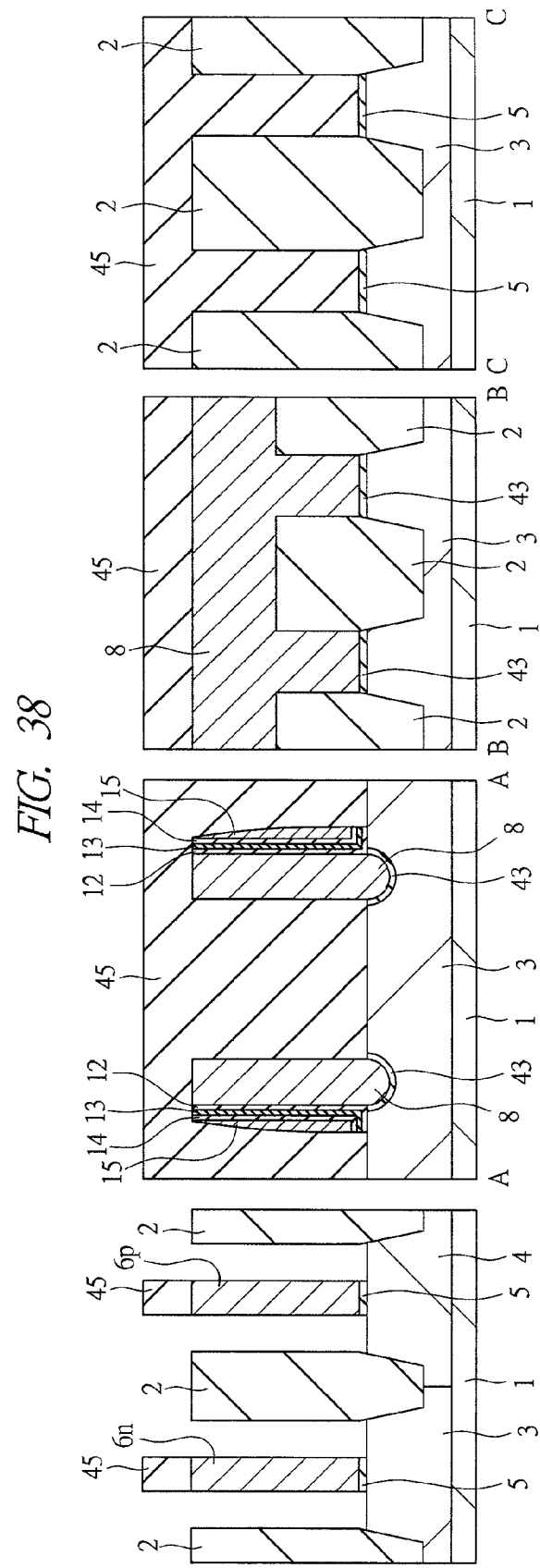
FIG. 38 is cross-sectional views of principal parts illustrating the method of manufacturing the semiconductor device continued from FIG. 37.

Next, as illustrated in FIG. 38, after the undoped polycrystalline silicon film 6 in the peripheral circuit region is patterned by dry etching with using a photoresist film 45 as a mask, the gate insulating film 5 is etched by using a diluted hydrofluoric acid aqueous solution, so that the gate insulating film 5 remains only below the undoped polycrystalline silicon film 6.

Figure 39:
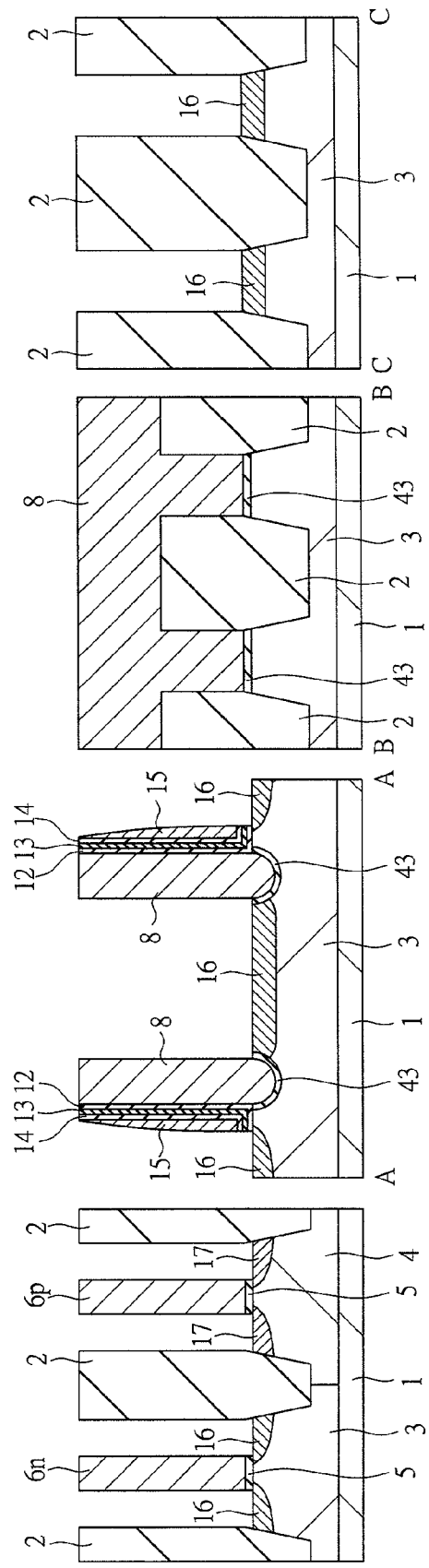
FIG. 39 is cross-sectional views of principal parts illustrating the method of manufacturing the semiconductor device continued from FIG. 38.

Next, as illustrated in FIG. 39, the photoresist film 45 is removed, and phosphorous is ion-implanted into the p-type well 3 in the memory array region and the p-type well 3 in the peripheral circuit region, so that n$^-$-type semiconductor regions 16 are formed in the p-type well 3 in the memory array region and the p-type well 3 in the peripheral circuit region. Also, the gate electrode 6n is formed above the p-type well 3 in the peripheral circuit region. Further, boron is ion-implanted into the n-type well 4, so that p$^-$-type semiconductor regions 17 and a gate electrode 6p are formed.

Figure 40:
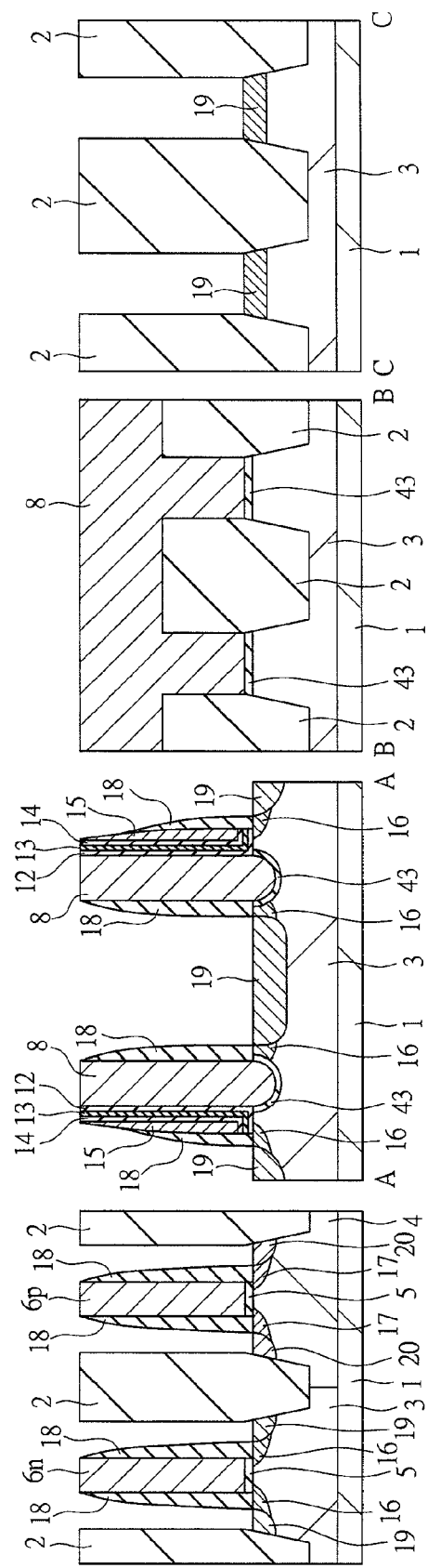
FIG. 40 is cross-sectional views of principal parts illustrating the method of manufacturing the semiconductor device continued from FIG. 39.
Figure 41:
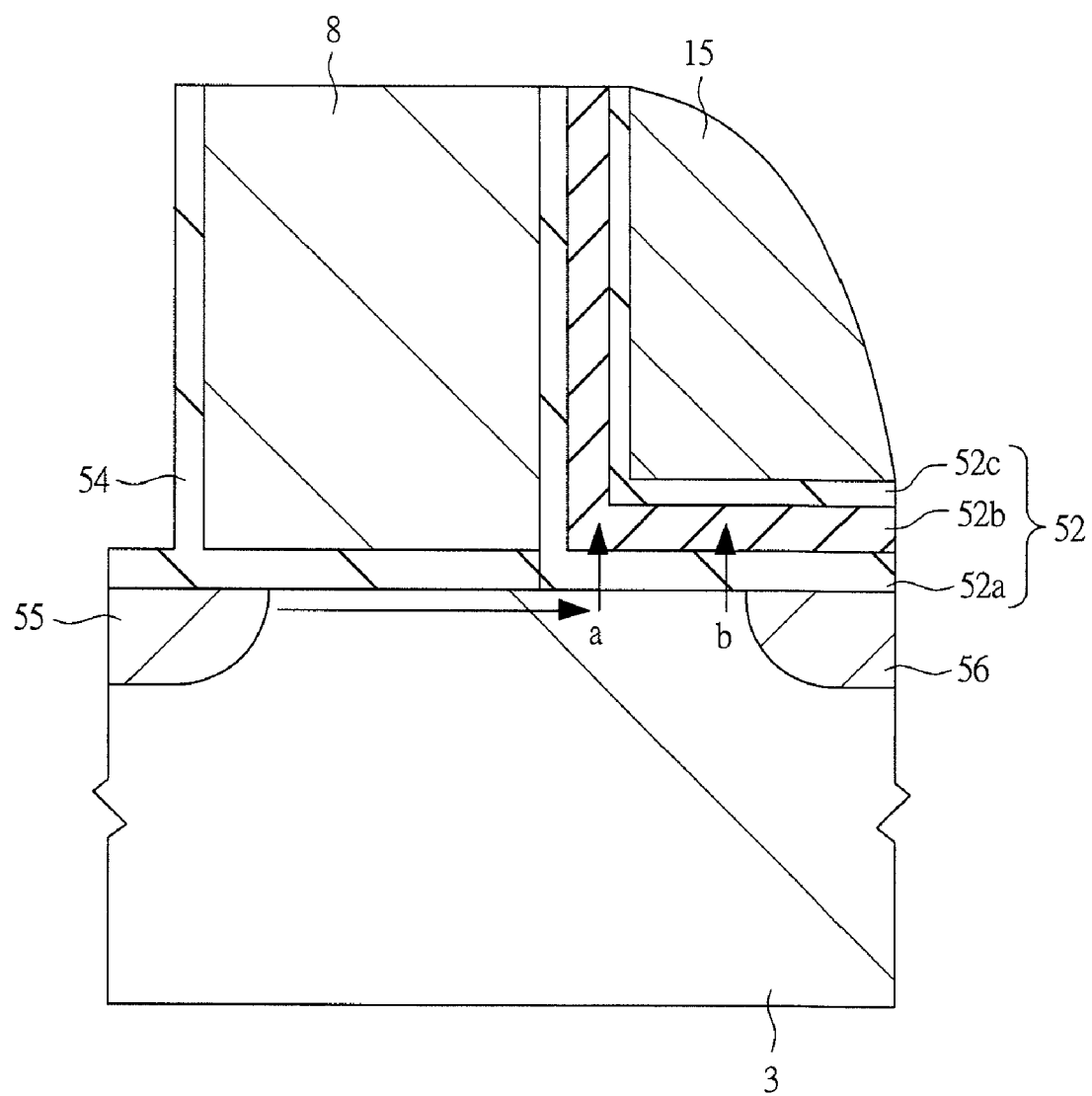
FIG. 41 is a cross-sectional view of a principal part of a conventional semiconductor device.

Next, as illustrated in FIG. 40, a sidewall spacer 18 is formed on one sidewall of each of the select gate 8 and the memory gate 15 formed in the memory array region, and a sidewall spacer 18 is formed on both sidewalls of each of the gate electrodes 6n and 6p in the peripheral circuit region. The sidewall spacers 18 are formed by anisotropically etching the silicon oxide film deposited on the silicon substrate 1 by a CVD method. Subsequently, phosphorous is ion-implanted into the p-type well 3 in the memory array region and the p-type well 3 in the peripheral circuit region, and boron is ion-implanted into the n-type well 4, and then, the silicon substrate 1 is subjected to thermal treatment to diffuse the above-described impurities, so that the n$^+$-type semiconductor regions (source/drain regions) 19 and p$^+$-type semiconductor regions (source/drain regions) 20 are formed. By the steps up to here, split gate type memory cells of the MONOS type are formed in the memory array region, and n-channel type and p-channel type MOS transistors are formed in the peripheral circuit region.

And then, an etching stopper film 36 composed of a silicon nitride film and an interlayer insulating film 37 composed of a silicon dioxide film are deposited on the silicon substrate 1. Subsequently, a contact hole 38 is formed in the etching stopper film 36 and the interlayer insulating film 37, and a plug 39 is buried inside of the contact hole 38, and then, a data line DL is formed on the interlayer insulating film 37, so that the above-described nonvolatile semiconductor storage device illustrated in FIG. 22 is completed.

In the foregoing, the invention made by the inventors has been concretely described based on the embodiments. However, it is needless to say that the present invention is not limited to the foregoing embodiments and various modifications and alterations can be made within the scope of the present invention.

A method of manufacturing a semiconductor device of the present invention can be widely used for a nonvolatile memory which can be mounted on a microcomputer.

What is claimed is:

1. A semiconductor device having a memory cell formed on a main surface of a semiconductor substrate of a first conductive type, wherein
   the memory cell includes:
   a select gate formed on the semiconductor substrate via a first gate insulating film;
   a memory gate formed on one sidewall of the select gate and insulated from the select gate and the semiconductor substrate via a second gate insulating film;
   a source region composed of a semiconductor region of a second conductive type and formed in the semiconductor substrate in a vicinity of the select gate; and
   a drain region composed of a semiconductor region of a second conductive type and formed in the semiconductor substrate in a vicinity of the memory gate,
   the second gate insulating film includes at least a first potential barrier film and a charge-trapping film stacked on the first potential barrier film, and
   a substrate interface of the select gate is positioned lower than a substrate interface of the memory gate.

2. The semiconductor device according to claim 1, wherein,
   when a distance between the select gate and the memory gate is assumed as a symbol x, a range of a step denoted by a symbol d between the substrate interface of the select gate and the substrate interface of the memory gate is 0 nm or larger and 16 nm or smaller if x is 17 nm or smaller, and is (1.8x–30) nm or larger and 16 nm or smaller if x is 17 nm or larger and 26 nm or smaller.

3. The semiconductor device according to claim 1, wherein the charge-trapping film is composed of a silicon nitride film.

4. The semiconductor device according to claim 1, wherein the second gate insulating film is composed of the first potential barrier film, the charge-trapping film stacked on the first potential barrier film, and a second potential barrier film stacked on the charge-trapping film.

5. The semiconductor device according to claim 1, wherein
   data writing of the memory cell is carried out by injecting hot electrons into the charge-trapping film from the semiconductor substrate side by tunneling through the second gate insulating film, and
   data erasing of the memory cell is carried out by injecting hot holes into the charge-trapping film from the semiconductor substrate side by tunneling through the second gate insulating film.

6. The semiconductor device according to claim 1, wherein a plurality of the memory cells are disposed in a matrix in a first direction and a second direction crossing the first direction at right angles.

7. The semiconductor device according to claim 1, wherein an insulating film is deposited and patterned on the semiconductor substrate, and electrode plugs each electrically connected to gate, source, and drain regions of the memory cell are formed in the insulating film.

8. A method of manufacturing a semiconductor device having a memory cell including:
   a select gate formed on a semiconductor substrate of a first conductive type via a first gate insulating film;
   a memory gate formed on one sidewall of the select gate and insulated from the select gate and the semiconductor substrate via a second gate insulating film;
   a source region composed of a semiconductor region of a second conductive type and formed in the semiconductor substrate in a vicinity of the select gate; and
   a drain region composed of a semiconductor region of a second conductive type and formed in the semiconductor substrate in a vicinity of the memory gate, and
   the second gate insulating film including at least a first potential barrier film and a charge-trapping film stacked on the first potential barrier film, wherein
   the method of manufacturing the semiconductor device comprises the steps of:
   (a) forming the select gate on the semiconductor substrate via the first gate insulating film;
   (b) after the step of (a), forming a silicon dioxide film so as to cover each surface of the semiconductor substrate and the select gate;
   (c) after the step of (b), exposing the surface of the semiconductor substrate by removing the silicon dioxide film on the surface of the semiconductor substrate;
   (d) after the step of (c), growing a silicon epitaxial layer on the exposed surface of the semiconductor substrate;
   (e) after the step of (d), forming the first potential barrier film composed of a silicon dioxide film by thermally oxidizing the semiconductor substrate to convert at least a part of the silicon epitaxial layer into the silicon dioxide film;
   (f) after the step of (e), forming the second gate insulating film by forming the charge-trapping film on the first barrier potential film;
   (g) after the step of (f), forming the memory gate on the one sidewall of the select gate by patterning a conductive film formed on the second gate insulating film;
   (h) after the step of (g), remaining the second gate insulating film between the one sidewall of the select gate and the memory gate and between the semiconductor substrate and the memory gate by patterning the second gate insulating film; and
   (i) forming the source region composed of the semiconductor region of the second conductive type in the semiconductor substrate in the vicinity of the select gate and forming the drain region composed of the semiconductor region of the second conductive type in the semiconductor substrate in the vicinity of the memory gate by doping impurities into the semiconductor substrate, and in the step of (d), a film thickness of the silicon epitaxial layer is controlled so that an upper surface of the silicon epitaxial layer in a vicinity of a lower-end portion of the select gate is positioned upper than an interface between the semiconductor substrate and the first gate insulating film.

9. The method of manufacturing the semiconductor device according to claim 8, wherein, when a distance between the select gate and the memory gate is assumed as a symbol x, a range of a step denoted by a symbol d between a substrate interface of the select gate and a substrate interface of the memory gate is 0 nm or larger and 16 nm or smaller if x is 17 nm or smaller, and is (1.8x−30) nm or larger and 16 nm or smaller if x is 17 nm or larger and 26 nm or smaller.

10. The method of manufacturing the semiconductor device according to claim 8, wherein the charge-trapping film is composed of a silicon nitride film.

11. The method of manufacturing the semiconductor device according to claim 8, wherein the second gate insulating film is composed of the first potential barrier film, the charge-trapping film stacked on the first potential barrier film, and a second potential barrier film stacked on the charge-trapping film.

12. The method of manufacturing the semiconductor device according to claim 8, wherein a plurality of the memory cells are formed in a matrix in a first direction and a second direction crossing the first direction at right angles.

13. The method of manufacturing the semiconductor device according to claim 8, wherein, after the step of (i), an insulating film is deposited and patterned on the semiconductor substrate, and electrode plugs each electrically connected to gate, source, and drain regions of the memory cell are formed in the insulating film.

14. A method of manufacturing a semiconductor device having a plurality of memory cells disposed in a matrix in a first direction and a second direction crossing the first direction at right angles on a main surface of a semiconductor substrate of a first conductive type, each of the plurality of memory cells including:

a select gate formed on the semiconductor substrate via a first gate insulating film;

a memory gate formed on one sidewall of the select gate and insulated from the select gate and the semiconductor substrate via a second gate insulating film;

a source region composed of a semiconductor region of a second conductive type and formed in the semiconductor substrate in a vicinity of the select gate; and a drain region composed of a semiconductor region of a second conductive type and formed in the semiconductor substrate in a vicinity of the memory gate, and the second gate insulating film including at least a first potential barrier film and a charge-trapping film stacked on the first potential barrier film, wherein a process of forming each of the plurality of memory cells comprising the steps of:

(a) forming the select gate so as to bury via the first gate insulating film by etching the semiconductor substrate with using a silicon nitride film as a mask on the semiconductor substrate;

(b) after the step of (a), forming a silicon dioxide film so as to cover each surface of the semiconductor substrate and the select gate;

(c) after the step of (b), exposing the surface of the semiconductor substrate by removing the silicon dioxide film on the surface of the semiconductor substrate;

(d) after the step of (c), forming the first potential barrier film composed of the silicon dioxide film by thermally oxidizing the semiconductor substrate;

(e) after the step of (d), forming the second gate insulating film by forming the charge-trapping film on the first barrier potential film;

(f) after the step of (e), forming the memory gate on one sidewall of the select gate by patterning a conductive film formed on the second gate insulating film;

(g) after the step of (f), remaining the second gate insulating film between the one sidewall of the select gate and the memory gate and between the semiconductor substrate and the memory gate by patterning the second gate insulating film; and (h) forming the source region composed of the semiconductor region of the second conductive type in the semiconductor substrate in the vicinity of the select gate and forming the drain region composed of the semiconductor region of the second conductive type in the semiconductor substrate in the vicinity of the memory gate by doping impurities into the semiconductor substrate.

15. The method of manufacturing the semiconductor device according to claim 14, wherein, when a distance between the select gate and the memory gate is assumed as a symbol x, a range of a step denoted by a symbol d between a substrate interface of the select gate and a substrate interface of the memory gate is 0 nm or larger and 16 nm or smaller if x is 17 nm or smaller, and is (1.8x−30) nm or larger and 16 nm or smaller if x is 17 nm or larger and 26 nm or smaller.

16. The method of manufacturing the semiconductor device according to claim 14, wherein the charge-trapping film is composed of a silicon nitride film.

17. The method of manufacturing the semiconductor device according to claim 14, wherein the second gate insulating film is composed of the first potential barrier film, the charge-trapping film stacked on the first potential barrier film, and a second potential barrier film stacked on the charge-trapping film.

18. The method of manufacturing the semiconductor device according to claim 14, wherein a plurality of the memory cells are formed in a matrix in a first direction and a second direction crossing the first direction at right angles.

19. The method of manufacturing the semiconductor device according to claim 14, wherein, after the step of (h), an insulating film is deposited and patterned on the semiconductor substrate, and electrode plugs each electrically connected to gate, source, and drain regions of the memory cell are formed in the insulating film.

* * * * *